United States Patent
Inagawa

(10) Patent No.: US 8,458,540 B2
(45) Date of Patent: Jun. 4, 2013

(54) INTEGRATED CIRCUIT AND DIAGNOSIS CIRCUIT

(75) Inventor: Ryoichi Inagawa, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 379 days.

(21) Appl. No.: 12/974,155

(22) Filed: Dec. 21, 2010

(65) Prior Publication Data

US 2011/0161756 A1   Jun. 30, 2011

(30) Foreign Application Priority Data

Dec. 24, 2009  (JP) .................................. 2009-293138

(51) Int. Cl.
*G06F 11/00*   (2006.01)
(52) U.S. Cl.
USPC .............. 714/726; 714/30; 714/738; 714/739
(58) Field of Classification Search
None
See application file for complete search history.

(56) References Cited

U.S. PATENT DOCUMENTS

| 6,976,199 B2 * | 12/2005 | Berry et al. .................. 714/726 |
| 7,246,287 B1 * | 7/2007 | Chua-Eoan et al. .......... 714/733 |
| 7,779,375 B2 * | 8/2010 | Grise et al. .................. 716/122 |
| 2003/0131295 A1 * | 7/2003 | Berry et al. .................. 714/726 |
| 2007/0061621 A1 | 3/2007 | Bae |

FOREIGN PATENT DOCUMENTS

| JP | 7-198787 A | 8/1995 |
| JP | 2006-300650 A | 11/2006 |
| JP | 2007-78689 A | 3/2007 |

* cited by examiner

*Primary Examiner* — Christopher McCarthy
(74) *Attorney, Agent, or Firm* — Fujitsu Patent Center

(57) ABSTRACT

A integrated circuit include: a first selection circuit selecting first data from input-data or scan-data, scan-data being for performing a diagnosis of a combinational circuit, input-data being received from a combinational circuit; a first latch circuit holding first data as first output-data in accordance with a first signal; a second latch circuit holding first output-data as second output-data in accordance with which of the first signal and a second signal, the second signal being used to force the second latch circuit to hold first output-data; a third latch circuit holding first output-data as third output-data in accordance with which of the first signal and a third signal, the third signal being used to force the third latch circuit to hold first output-data; and a second selection circuit selecting second data from among the data which include second output-data and third output-data.

9 Claims, 22 Drawing Sheets

INTEGRATED CIRCUIT AND DIAGNOSIS CIRCUIT

CROSS REFERENCE TO RELATED APPLICATION

This application is based upon and claims the benefit of priority from the prior Japanese Patent Application NO. 2009-293138 filed on Dec. 24, 2009, the entire contents of which are incorporated herein by reference.

FIELD

The embodiments discussed herein are related to an integrated circuit and a diagnosis circuit that performs a fault diagnosis of the integrated circuit.

BACKGROUND

There is a known approach to improving the reliability of an integrated circuit by embedding a fault diagnosis circuit that detects a fault in the integrated circuit and causing the fault diagnosis circuit to operate to detect a fault in the integrated circuit in operation. One example is a BIST (Built-In-Self-Test) mechanism.

For example, an integrated circuit having a diagnosis circuit for a logic circuit has been proposed. The integrated circuit includes a register which holds an internal state of the logic circuit and a restoration circuit which inputs the internal state held in the register into the logic circuit, and switches between a normal operation and a diagnosis operation. The integrated circuit continues a diagnosis operation while responding to access from another circuit, or discontinues the diagnosis operation and returns the circuit to the state it was in before the diagnosis operation. (See for example Japanese Laid-Open Patent Publication No. 2006-300650.)

Scan flip-flop circuits capable of scan testing are also known. For example, a scan flip-flop circuit has been proposed in which a latch circuit of a cell in a master stage is disconnected from a latch circuit of a cell in a slave stage at the time scan data is set, thereby preventing the set scan data from being output. (See for example Japanese Laid-Open Patent Publications No. H7-198787 and No. 2007-78689.)

The fault diagnosis described above is performed while the integrated circuit holds the input data before the fault diagnosis, and when the integrated circuit is switched from the fault diagnosis operation to the normal operation, the held data is used to return the integrated circuit to the state it was in before the fault diagnosis. However, the transition from the fault diagnosis operation to the normal operation in the existing techniques is not straightforward. For example, when the integrated circuit is returned from the fault diagnosis operation to the normal operation, an extra process for writing the held data into a circuit in the integrated circuit is performed.

SUMMARY

According to one aspect of the embodiments, an integrated circuit disclosed herein includes a first selection circuit for selecting a first data from an input data or a scan data, and outputting the first data, the scan data composing a logic pattern that is used for performing a diagnosis of a combinational circuit, the input data being received from a combinational circuit; a first latch circuit for holding the first data as a first output data in accordance with a first signal; a second latch circuit for holding the first output data as a second output data in accordance with which of the first signal and a second signal, the second signal being used to force the second latch circuit to hold the first output data independently of the first signal; a third latch circuit for holding the first output data as a third output data in accordance with which of the first signal and a third signal, the third signal being used to force the third latch circuit to hold the first output data independently of the first signal; and a second selection circuit for selecting a second data from among a plurality of data which include the second output data and the third output data, and outputting the second data.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

Exemplary embodiments will be described with reference to drawings.

First Embodiment

A first embodiment will be described below.
(Exemplary Application)

Figure 1:
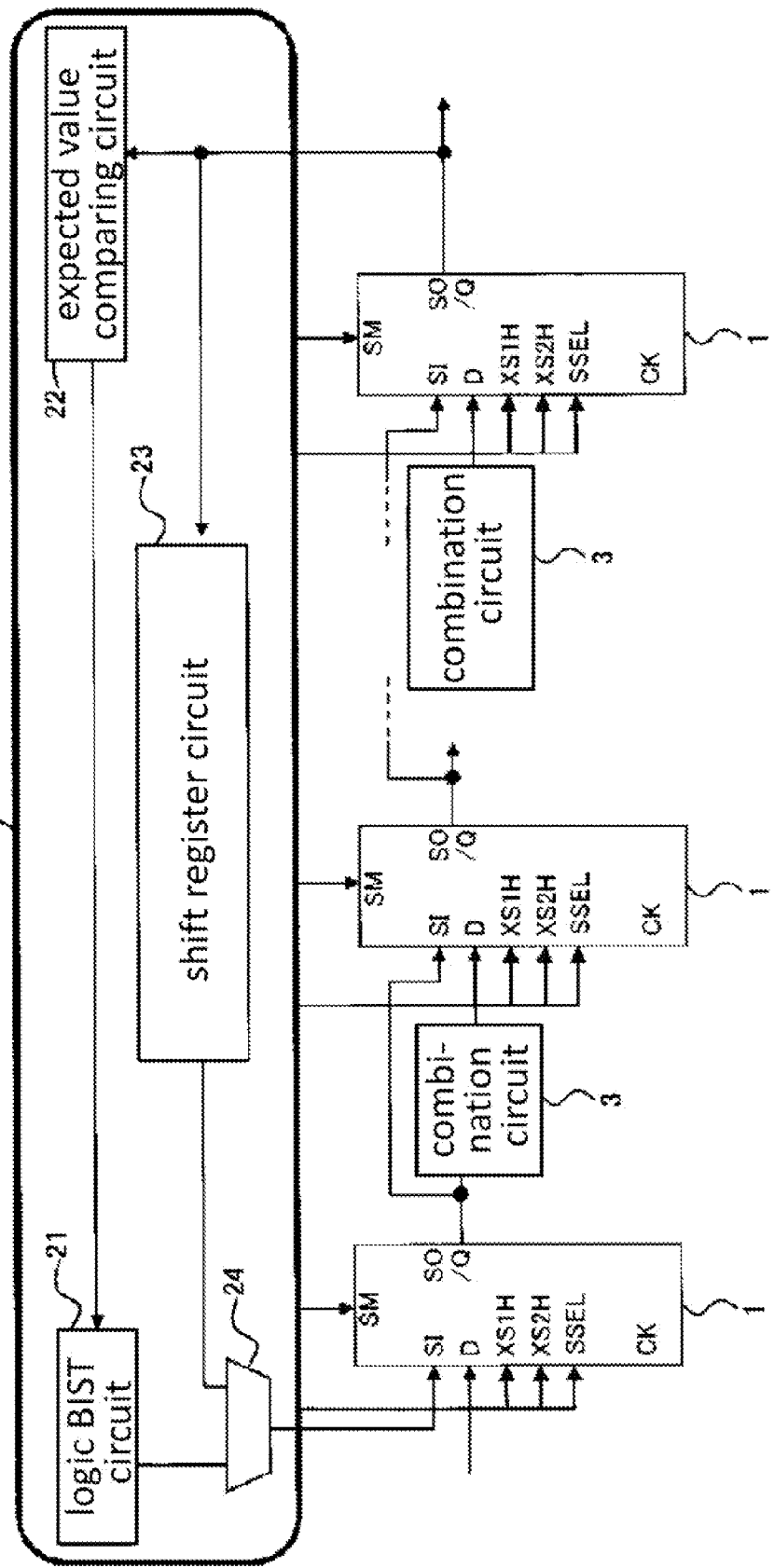
FIG. 1 is a block diagram illustrating an example of application of scan flip-flops (SFFs) and a fault diagnosis circuit according to a first embodiment.

FIG. 1 is a block diagram illustrating an example of application of scan flip-flop circuits 1 (hereinafter sometimes abbreviated as "SFFs") and a fault diagnosis circuit 2 according to the first embodiment. Multiple SFFs 1 are arranged in series with combinational circuits 3 being provided between every two SFFs as illustrated in FIG. 1. One SFF 1 transfers input data to the next through the subsequent combinational circuit 3, and so on. The fault diagnosis circuit 2 performs fault diagnosis of the multiple SFFs 1. The SFF 1 at the first stage (foremost stage) of the series is hereinafter referred to as the "foremost SFF 1" while the SFF 1 at the last stage (backmost stage) is referred to as the "last SFF 1". The SFFs 1 are an example of an integrated circuit (semiconductor integrated circuit).

Each SFF 1 is basically a 1-bit memory circuit capable of holding one state such as one "0" or "1" and is capable of a diagnosis test in a scan test mode. For example, each SFF 1 includes a latch circuit (hereinafter referred to as the "master latch circuit") that constitutes a master-stage cell, not depicted, and two latch circuits (hereinafter referred to as the "first slave latch circuit" and the "second slave latch circuit") that constitute a slave-stage cell. The master latch circuit and the first and second slave latch circuits will be described later in detail.

Each of the SFFs 1, excluding the foremost one, are provided with input data D from the combinational circuit 3 and a clock signal CK from an external circuit (not depicted). The foremost SFF 1 is provided with input data D from an external circuit (not depicted). Each of the SFFs 1 is also provided with scan data SI (hereinafter sometimes referred to as the "scan-in data SI") for fault diagnosis from the preceding SFF 1. The foremost SFF 1 is provided with the scan-in data SI from the fault diagnosis circuit 2.

Furthermore, a first output hold signal XS1H for forcing the first slave latch circuit to hold data irrespective of the clock signal CK and a second output hold signal XS2H for forcing the second slave latch circuits to hold data irrespective of the clock signal CK are provided from the fault diagnosis circuit 2 to the SFFs 1. In addition, a signal for setting a scan mode SM and a selection signal SSEL for selecting one of outputs from the first and second slave latch circuits are provided from the fault diagnosis circuit 2 to the SFFs 1.

The SFFs 1 output one of output data Q corresponding to input data D and scan data SO (hereinafter sometimes referred to as "scan-out data SO") corresponding to scan-in data SI. Basically, the output data Q is provided to the combinational circuit 3 and the scan-out data SO is provided to the subsequent SFF 1 by bypassing the combinational circuit 3. Output data Q output from the last SFF 1 is provided to an external circuit and scan-out data SO output from the last SFF 1 is provided to the fault diagnosis circuit 2.

The fault diagnosis circuit 2 includes a logic BIST circuit 21, an expected value comparing circuit 22, a shift register circuit 23, and a selector 24. The fault diagnosis circuit 2 provides the scan-in data SI, the first output hold signal XS1H, the second output hold signal XS2H, the signal for setting the scan mode SM, and the selection signal SSEL described above to the SFFs 1.

The logic BIST circuit 21 generates scan data for fault diagnosis. For example, the logic BIST circuit 21 generates a pattern (for example, a random number pattern) that depends on fault diagnosis and outputs the pattern as scan data. The scan data output from the logic BIST circuit 21 is provided to the selector 24 and the expected value comparing circuit 22. For purposes of the present embodiments, "to generate scan data" is meant to encompass using preset scan data as well as generating new scan data.

The expected value comparing circuit 22 is provided with scan-out data SO output from the last SFF 1 and performs fault diagnosis of SFFs 1 on the basis of the scan-out data SO. For example, the expected value comparing circuit 22 uses as an expected value a value corresponding to data to be ultimately output from the last SFF 1 when scan data generated by the logic BIST circuit 21 is provided to the multiple SFFs 1. In this case, the expected value comparing circuit 22 uses an expected value that depends on the scan data generated by the logic BIST circuit 21. The expected value comparing circuit 22 compares the expected value with scan-out data SO output from the last SFF 1 to make a fault diagnosis. For example, the expected value comparing circuit 22 makes a fault diagnosis using a technique such as CRC (Cyclic Redundancy Check).

The shift register circuit 23 includes multiple flip-flop circuits cascaded in series, for example, in which input data is shifted. For example, when fault diagnosis is performed using scan data, the shift register circuit 23 is provided with output data Q output from the last SFF 1 and holds the output data Q. The shift register circuit 23 outputs the held data Q at a timing delayed according to the scan data generated by the logic BIST circuit 21. The data output from the shift register circuit 23 is provided to the selector 24. For example, for the logic BIST circuit 21 that generates three patterns of scan data, the shift register circuit 23 is configured as a 3-stage shift register circuit.

The selector 24 is provided with scan data generated by the logic BIST circuit 21 and data output from the shift register circuit 23. The selector 24 selects one of scan data and data output from the shift register circuit 23 under the control of a circuit, not depicted, in the fault diagnosis circuit 2, and outputs the selected data. The data output from the selector 24 is provided to the foremost SFF 1. The scan data is provided to the foremost SFF 1 as scan-in data SI.

The combinational circuit 3 is a logic circuit where an output is determined by a combination of current input values. The combinational circuit 3 is provided between two SFFs 1 and is provided with data output from the preceding SFF 1. Basically, the combinational circuit 3 is provided with output data Q from the preceding SFF 1. The combinational circuit 3 performs a certain computation on the provided data and outputs data corresponding to the result of the computation. The data output from the combinational circuit 3 is provided to the subsequent SFF 1 as input data D.

(Configuration of the SFF)

Figure 2:
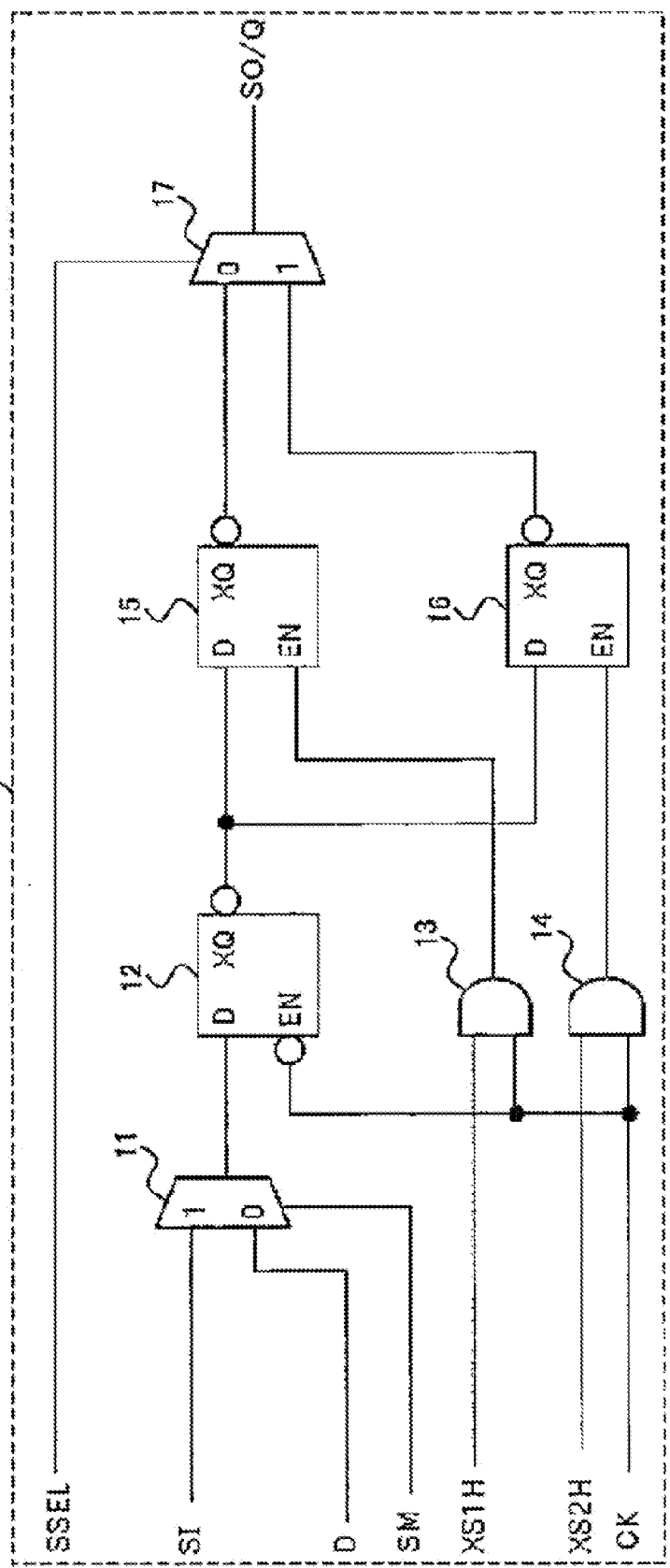
FIG. 2 is a block diagram illustrating an exemplary configuration of an SFF according to the first embodiment.

FIG. 2 is a block diagram illustrating an exemplary configuration of the SFF 1 according to the first embodiment. The SFF 1 includes a selector 11, a master latch circuit 12, AND circuits 13 and 14, a first slave latch circuit 15, a second slave latch circuit 16, and a selector 17 as illustrated in FIG. 2. As has been described above, the SFF 1 is provided with input data D from the combinational circuit 3 or an external circuit and is also provided with a clock signal CK from an external circuit. The SFF 1 is provided with scan-in data SI from the preceding SFF 1 or the fault diagnosis circuit 2. In addition, the SFF 1 is provided with the first output hold signal XS1H, the second output hold signal XS2H, a signal for setting a scan mode SM, and a selection signal SSEL from the fault diagnosis circuit 2.

The selector 11 is provided with scan-in data SI and input data D as well as the signal for setting the scan mode SM. The selector 11 selects one of the scan-in data SI and the input data D depending on the scan mode SM, and outputs the selected data. When the scan mode SM is "0", the selector 11 outputs the input data D; when the scan mode is "1", the selector 11 outputs the scan-in data SI. Basically, the scan mode SM is set to "0" when a normal operation is performed and set to "1" when fault diagnosis is performed. The data output from the selector 11 is provided to the master latch circuit 12. The selector 11 is an example of the input selector circuit.

The master latch circuit 12 is configured as the so-called D-latch circuit. Basically, the master latch circuit 12 is provided with data output from the selector 11 as well as the clock signal CK (equivalent to an enable signal) and holds data output from the selector 11 that depends on the clock signal CK. For example, when the clock signal CK inverted (hereinafter simply referred to as the "inverted clock signal") is high, the master latch circuit 12 outputs inverted input data. On the other hand, when the inverted clock signal is low, the master latch circuit 12 holds data previously input in the master latch circuit 12. In the latter case, irrespective of the data currently input in the master latch circuit 12, the master latch circuit 12 continues outputting data corresponding to the data input immediately before the inverted clock signal has become low. The data output from the master latch circuit 12 is provided to both of the first and second slave latch circuits 15 and 16. That is, the first and second slave latch circuits 15 and 16 are connected in parallel with the master latch circuit 12. The master latch circuit 12 is one example of the first memory circuit and the clock signal CK is one example of the first control signal.

The AND circuits 13 and 14 are provided with the clock signal CK and also provided with a first output hold signal XS1H and a second output hold signal XS2H (hereinafter simply referred to as "output hold signals XS1H and XS2H" unless distinction between them is requested), respectively. The AND circuits 13 and 14 directly output the clock signal CK provided to them when the output hold signals XS1H and XS2H, respectively, are "1". On the other hand, when the output hold signals XS1H and XS2H are "0", the AND circuits 13 and 14, respectively, output "0" irrespective of the clock signal CK provided to them. That is, when the output hold signals XS1H and XS2H are "0", the clock signal CK is negated (or, disabled) by the AND circuits 13 and 14. Data output from the AND circuits 13 and 14 are provided to the first slave latch circuit 15 and the second slave latch circuit 16, respectively.

Basically, when the first slave latch circuit 15 is to be forced to hold data irrespective of the clock signal CK, the first output hold signal XS1H is set to "0". On the other hand, when the second slave latch circuit 16 is to be forced to hold data irrespective of the clock signal CK, the second output hold signal XS2H is set to "0". For example, when fault diagnosis is performed, at least one of the first and second output hold signals XS1H and XS2H is set to "0". The AND circuits 13 and 14 are an example of the control signal output circuit. Here, the outputs from the AND circuits 13 and 14 when the output hold signals XS1H and XS2H are "0", namely signals of "0" output from the AND circuits 13 and 14, are an example of the second control signal. The fault diagnosis circuit 2 described above is an example of a control circuit that controls the AND circuits 13 and 14 to force at least one of the first and second slave latch circuits 15 and 16 to hold data irrespective of the clock signal CK. Here, the fault diagnosis circuit 2 sets the output hold signals XS1H and XS2H to control the AND circuits 13 and 14.

Each of the first and second slave latch circuits 15 and 16 (hereinafter simply referred to as the "slave latch circuits 15 and 16" unless distinction between them is requested) are configured to function as the so-called D-latch circuit. The slave latch circuits 15 and 16 are provided with data output from the master latch circuit 12 and also data output from the AND circuits 13 and 14, respectively. The slave latch circuits 15 and 16 use the data output from the AND circuits 13 and 14, respectively, as a control signal to hold the data input from the master latch circuit 12. For example, when the data output from the AND circuits 13 and 14 are high, the slave latch circuits 15 and 16 output inverted input data. On the other hand, when the data output from the AND circuits 13 and 14 are low, the slave latch circuits 15 and 16 hold the outputs. In the latter case, irrespective of the data currently input in the slave latch circuits 15 and 16, the slave latch circuits 15 and 16 continue outputting data corresponding to the data input to the slave latch circuits 15 and 16 immediately before data output from the AND circuits 13 and 14 has become low. The data output from the slave latch circuits 15 and 16 are provided to the selector 17. The slave latch circuits 15 and 16 are an example of the second memory circuit.

The selector 17 is provided with data output from the slave latch circuits 15 and 16 and the selection signal SSEL. The selector 17 selects data output from one of the first and second slave latch circuits 15 and 16 depending on the selection signal SSEL and outputs the selected data. For example, when the selection signal SSEL is "0", the selector 17 selects data output from the first slave latch circuit 15; when the selection signal SSEL is "1", the selector 17 selects data output from the second slave latch circuit 16. The data output from the selector 17 is equivalent to the output data Q or the scan-out data SO described above. Basically, the output data Q is provided to the combinational circuit 3 and the scan-out data SO is provided to the subsequent SFF 1 by bypassing the combinational circuit 3. The selector 17 is an example of the output selector circuit.

(Example of Normal Operation)

An exemplary normal operation of the SFFs 1 and the fault diagnosis circuit 2 according to the first embodiment will be described below. The term "normal operation" as used herein refers to an operation in which each SFF 1 transfers input data D input from the preceding combinational circuit 3 to the subsequent combinational circuit 3 as output data Q in response to the clock signal CK. In the normal operation, the fault diagnosis circuit 2 basically performs no operation (except an operation for providing a signal for controlling the circuits in each SFF 1).

Figure 3A:
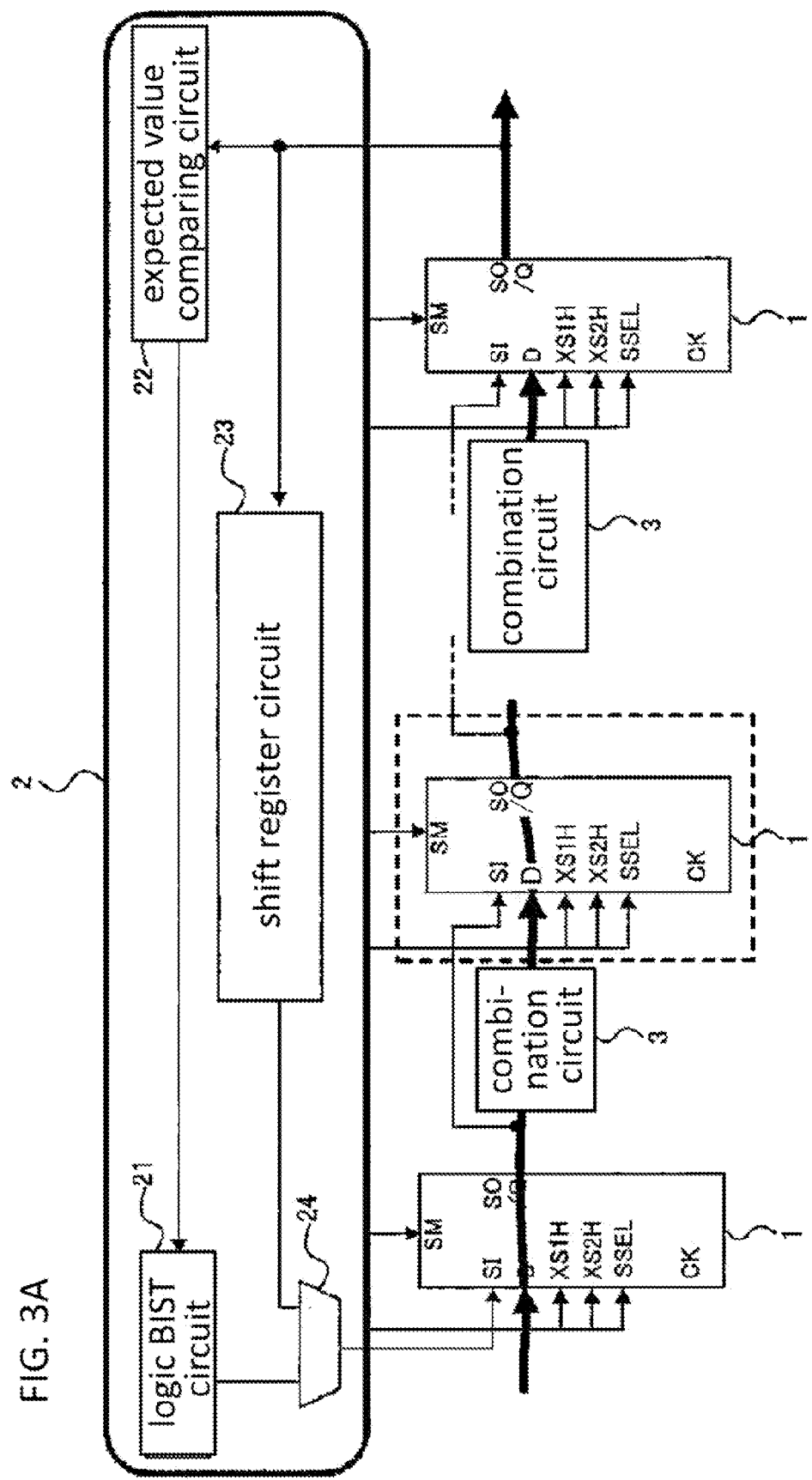
FIGS. 3A and 3B illustrate an exemplary normal operation of the SFFs and the fault diagnosis circuit according to the first embodiment.
Figure 3B:
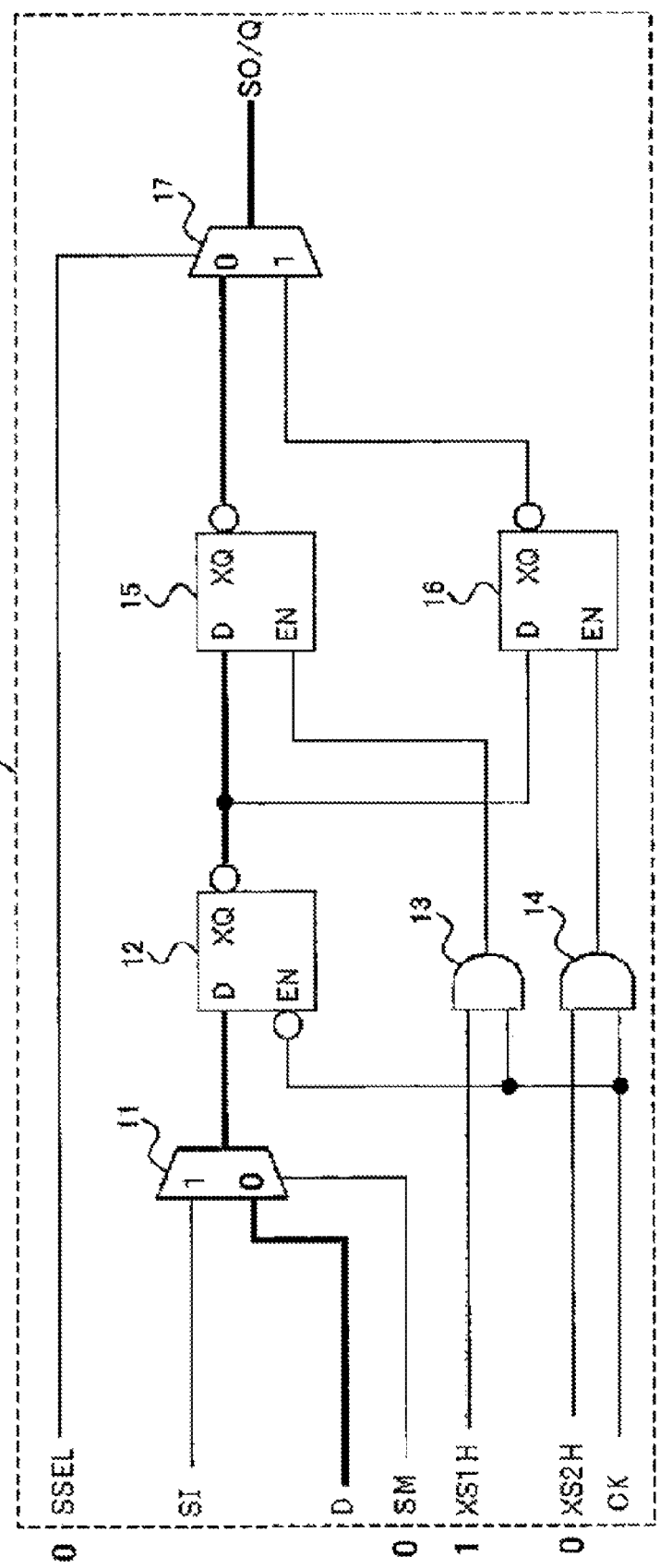

FIGS. 3A and 3B illustrate an example of a normal operation of the SFFs 1 and the fault diagnosis circuit 2 according to the first embodiment.

FIG. 3A illustrates an example of data flow during the normal operation of the SFF 1. The arrows in FIG. 3A represent the flow of data. In the normal operation, each SFF 1 is provided with input data D from the preceding combinational circuit 3 and provides output data Q corresponding to the input data D to the subsequent combinational circuit 3 in response to the clock signal CK. Each combinational circuit 3 is provided with the output data Q from the preceding SFF 1, performs a certain computation on the output data Q, and provides the result of the computation to the subsequent SFF 1 as input data D.

FIG. 3B illustrates an example of main data flow in the normal operation of the SFF 1 enclosed in the dashed box in FIG. 3A. The thick lines in FIG. 3B represent the data flow. In the normal operation, the scan mode SM is set to "0". Accordingly, the selector 11 outputs the input data D, which is then provided to the master latch circuit 12. The master latch circuit 12 outputs data corresponding to the input data D to the slave latch circuits 15 and 16 in response to the clock signal CK.

In the normal operation, the first output hold signal XS1H is set to "1". Accordingly, the AND circuit 13 directly outputs the clock signal CK, which is then provided to the first slave latch circuit 15. In this case, the first slave latch circuit 15 outputs data that depends on the data input from the master latch circuit 12 in response to the clock signal CK.

On the other hand, the second output hold signal XS2H is set to "0" in the normal operation. Accordingly, the AND circuit 14 outputs "0", which is then provided to the second slave latch circuit 16 as a control signal. That is, the clock signal CK is blocked from being provided to the second slave latch circuit 16. In this case, the second slave latch circuit 16 holds a certain output irrespective of the input from the master latch circuit 12.

Furthermore, the selection signal SSEL is set to "0" in the normal operation. Accordingly, the selector 17 outputs data corresponding to the data output from the first slave latch circuit 15, that is, data corresponding to the input data D, as output data Q.

While the second output hold signal XS2H is set to "0" in the normal operation in the example in FIGS. 3A and 3B, the second output hold signal XS2H may be set to "1" instead of "0". That is, the clock signal CK may be provided to the second slave latch circuit 16, rather than blocking the clock signal CK from being provided to the second slave latch circuit 16.

(Example of Fault Diagnosis Operation)

An exemplary fault diagnosis operation according to the first embodiment will be described below.

(a) Fault Diagnosis of a First Slave Path

An example of fault diagnosis of a path in which scan data is shifted by the SFFs 1 will be described (hereinafter the path is referred to as the "scan shift path"). In particular, an example of fault diagnosis of the scan shift path relating to the first slave latch circuit 15 will be described (hereinafter the scan shift path is referred to as the "first slave path"). The fault diagnosis of the first slave path includes fault diagnosis of the first slave latch circuit 15. The scan shift path basically does not pass through any of the combinational circuits 3.

In the first embodiment, fault diagnosis of the first slave path uses an output from the first slave latch circuit 15. The fault diagnosis of the first slave path uses the shift register circuit 23. For example, the fault diagnosis of the first slave path is performed while the data corresponding to the input data D that was input before the fault diagnosis is held in the shift register circuit 23.

Figure 4A:
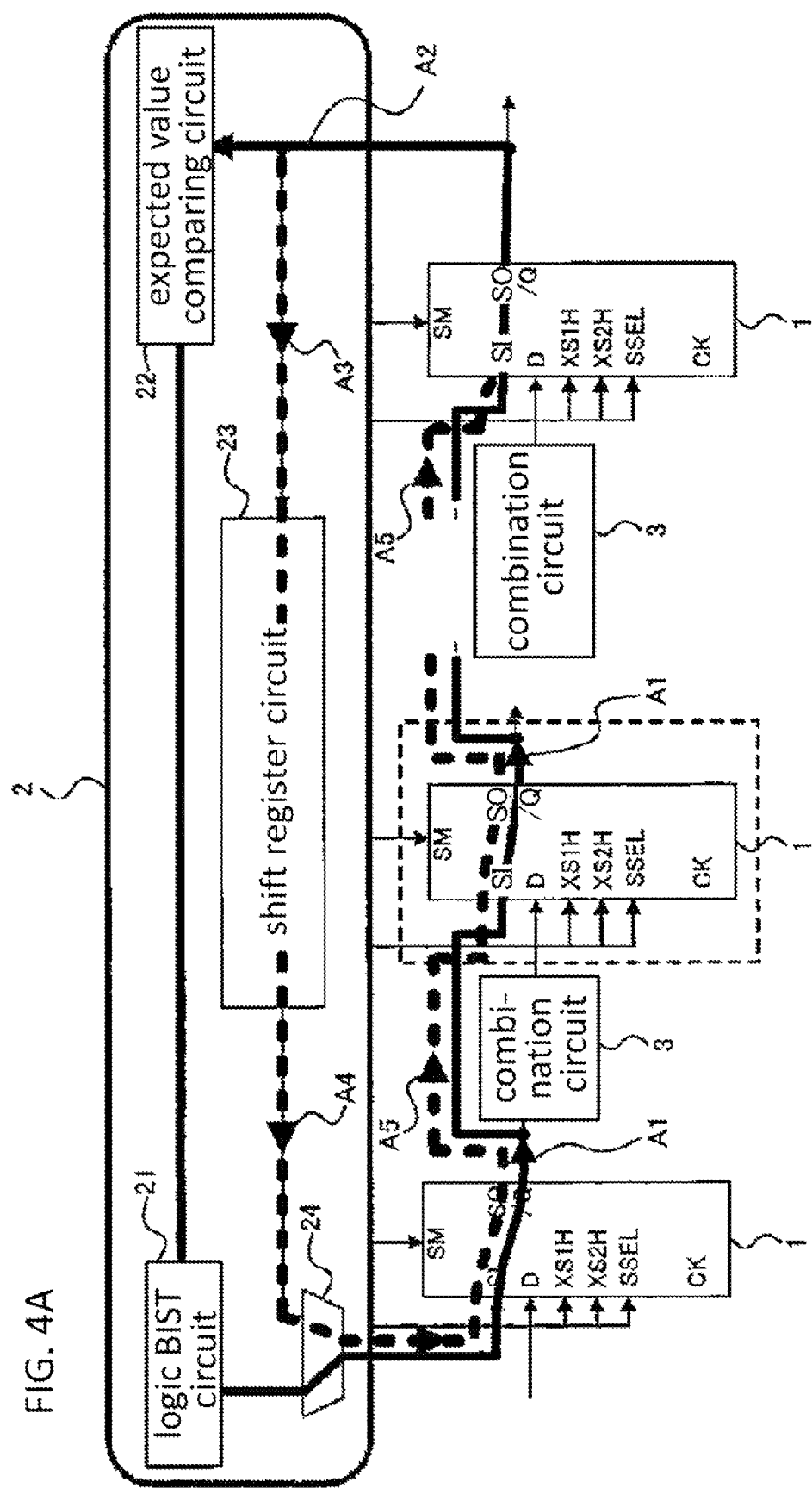
FIGS. 4A and 4B illustrate an exemplary fault diagnosis operation of a first slave path according to the first embodiment.
Figure 4B:
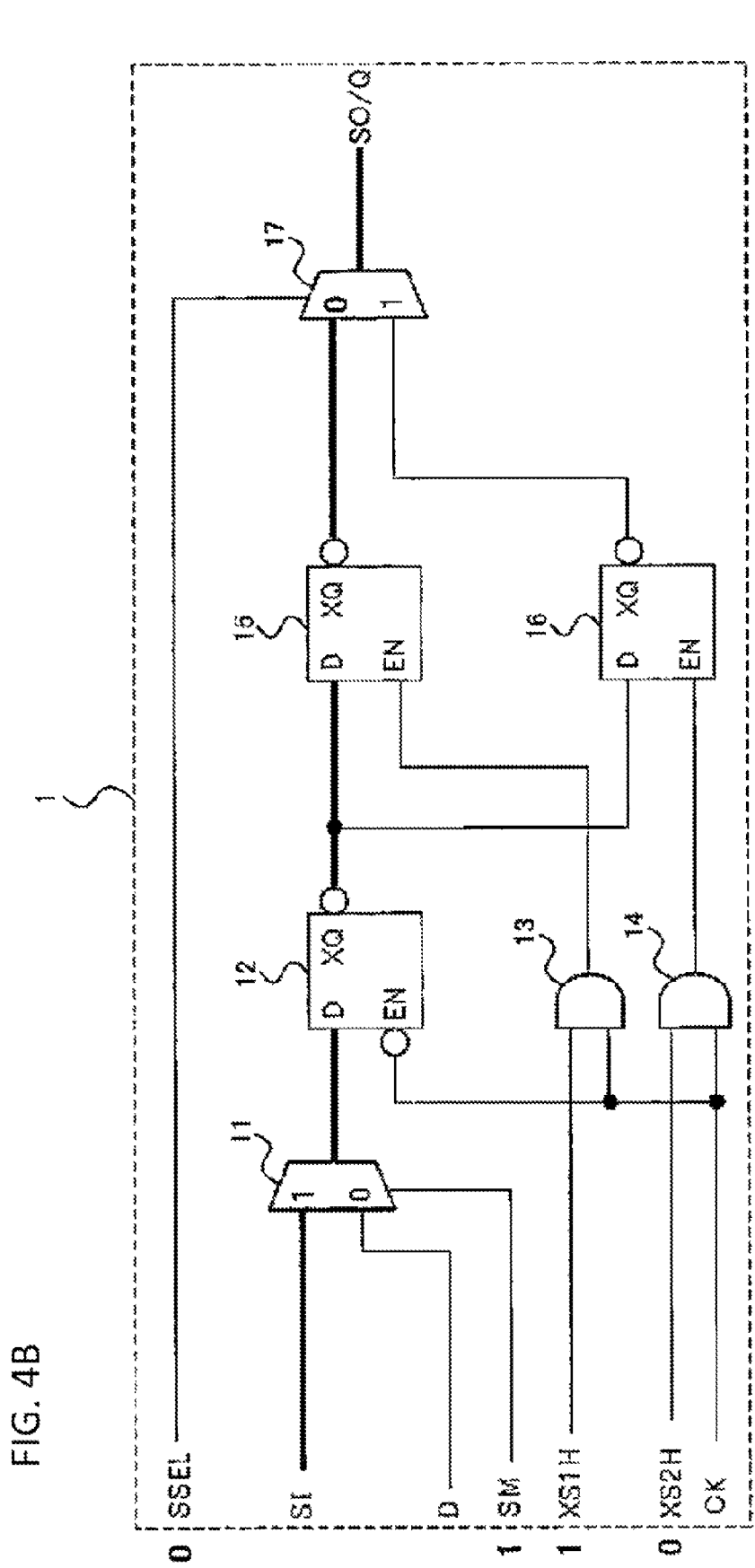

FIGS. 4A and 4B illustrate an example of the fault diagnosis operation on the first slave path according to the first embodiment. FIG. 4A illustrates an exemplary data flow relating to the SFFs 1 and the fault diagnosis circuit 2 in the fault diagnosis of the first slave path.

In the fault diagnosis of the first slave path, the logic BIST circuit 21 in the fault diagnosis circuit 2 generates scan data with which the first slave path can be appropriately tested. For example, the logic BIST circuit 21 generates three patterns of scan data such as "010". The scan data generated by the logic BIST circuit 21 is provided to the selector 24. The selector 24 selects the scan data to provide the scan data to the foremost SFF 1 as scan-in data SI.

The provision of the scan-in data SI to the foremost SFF 1 initiates the fault diagnosis of the first slave path. The SFF 1 transfers the scan data to the next SFF 1, which then provides the scan data to the next, and so on, as indicated by arrow A1 in FIG. 4A. That is, one SFF 1 is provided with the scan-in data SI from the preceding SFF 1 and provides the scan-out data SO corresponding to the scan-in data SI to the subsequent SFF 1 by bypassing the combinational circuit 3. In this case, each of the SFFs 1 uses an output from the first slave latch circuit 15 in the SFF 1 to transfer the scan data.

When the scan data transferred in this way reaches the last SFF 1, the last SFF 1 provides the scan-out data SO to the expected value comparing circuit 22 as indicated by arrow A2 in FIG. 4A. The expected value comparing circuit 22 compares the scan-out data SO output from the last SFF 1 with an expected value corresponding to the scan data generated by the logic BIST circuit 21 to make a fault diagnosis of the first slave path.

At the start of the fault diagnosis of the first slave path described above, output data Q output from the last SFF 1 is provided to the shift register circuit 23 as indicated by dashed arrow A3 in FIG. 4A. For example, when the fault diagnosis circuit 2 has started providing scan data to the foremost SFF 1, the output data Q output from the last SFF 1 is provided to the shift register circuit 23. In this case, the shift register circuit 23 holds the provided output data Q. The shift register circuit 23 then outputs the held data to the selector 24 as indicated by dashed arrow A4 in FIG. 4A at a timing delayed according to the number of patterns of the scan data generated by the logic BIST circuit 21. Because the shift register circuit 23 outputs the data at a timing delayed according to the number of patterns of the scan data, the data is provided from the shift register circuit 23 to the selector 24 at the time the logic BIST circuit 21 has finished outputting the scan data. For example, when the logic BIST circuit 21 has generated three patterns of scan data, the shift register circuit 23 outputs the held data with a time delay equivalent to the three patterns.

In this way, the shift register circuit 23 holds output data Q sequentially provided from the last SFF 1 and sequentially outputs the output data Q to the selector 24 with a time delay equivalent to the number of patterns of scan data during the fault diagnosis of the first slave path. The selector 24 selects the data output from the shift register circuit 23 to provide the data to the foremost SFF 1. For example, when the logic BIST circuit 21 has finished outputting scan data, the selector 24 switches from the scan data to the data output from the shift register circuit 23 and outputs the data. The data provided from the selector 24 (that is the output data Q output from the last SFF 1) is then transferred from one SFF 1 to the next SFF 1 as indicated by dashed arrow A5 in FIG. 4A.

After the completion of the fault diagnosis of the first slave path, the SFFs 1 are returned to the state they were in immediately before the fault diagnosis, because the shift register circuit 23 operates as described above. That is, the SFFs 1 properly hold the data that the SFFs 1 held immediately before the fault diagnosis of the first slave path.

The operation of the shift register circuit 23 described above is continued until the fault diagnosis of the first slave path ends. That is, the operation is continued until the output of the scan data from the last SFF 1 to the expected value comparing circuit 22 ends. The shift register circuit 23 basically does not operate except during fault diagnosis of the first slave path.

FIG. 4B illustrates an example of main data flow relating to the SFF 1 enclosed in the dashed box in FIG. 4A in the fault diagnosis of the first slave path. The thick lines in FIG. 4B represent the data flow. When the fault diagnosis of the first slave path is performed, the scan mode SM is set to "1". Accordingly, the selector 11 outputs scan-in data SI, which is then provided to the master latch circuit 12. The master latch circuit 12 outputs data corresponding to the scan-in data SI to the slave latch circuits 15 and 16 in response to the clock signal CK.

In the fault diagnosis of the first slave path, the first output hold signal XS1H is set to "1". Accordingly, the AND circuit 13 directly outputs the clock signal CK, which is then provided to the first slave latch circuit 15. In this case, the first slave latch circuit 15 outputs data corresponding to the data input from the master latch circuit 12 in response to the clock signal CK.

The second output hold signal XS2H, on the other hand, is set to "0" in the fault diagnosis of the first slave path. Accordingly, the AND circuit 14 outputs "0", which is then provided to the second slave latch circuit 16 as a control signal. That is, the clock signal CK is blocked from being provided to the second slave latch circuit 16. In this case, the second slave latch circuit 16 holds a certain output irrespective of the input from the master latch circuit 12. The clock signal CK is blocked from being provided to the second slave latch circuit 16 in case a stuck fault has occurred to cause the selector 17 in the last stage to select the output from the second slave latch circuit 16.

Furthermore, in the fault diagnosis of the second slave path, the selection signal SSEL is set to "0". Accordingly, the selector 17 outputs data corresponding to the data output from the first slave latch circuit 15, that is, data corresponding to the scan-in data SI, as scan-out data SO.

These signals set the circuits in each SFF 1 to enable proper fault diagnosis of the first slave path based on the scan data output from the first slave latch circuit 15.

As has been described above, the shift register circuit 23 in the fault diagnosis circuit 2 holds output data Q provided from the last SFF 1 and outputs the output data Q with a time delay equivalent to the number of patterns of scan data in the fault diagnosis of the first slave path. This mechanism enables the SFFs 1 to be properly returned to the state they were in immediately before the fault diagnosis, after the fault diagnosis of the first slave path has completed. Accordingly, the fault diagnosis of the first slave latch circuit 15 can be properly performed. In particular, the fault diagnosis of the first slave latch circuit 15, which is responsible for holding data corresponding to the input data D during subsequent fault diagnosis of a second slave path and the combinational circuits 3, which will be described below, can be performed appropriately.

(b) Fault Diagnosis of a Second Slave Path

An example of fault diagnosis of a scan shift path relating to the second slave latch circuit 16 (hereinafter referred to as the "second slave path") according to the first embodiment will be described below. The fault diagnosis of the second slave path differs from the fault diagnosis of the first slave path in that an output from the second slave latch circuit 16 is used to perform the fault diagnosis while data that was input before the fault diagnosis is held in the first slave latch circuit 15. That is, during the fault diagnosis of the second slave path, data is held in the first slave latch circuit 15 instead of the shift register circuit 23 as in the fault diagnosis of the first slave path.

The fault diagnosis of the second slave path is preferably performed after the fault diagnosis of the first slave path. The reason is that it is desirable that the fault diagnosis of the second slave path be performed after the proper operation of the first slave latch circuit 15 has been verified, because data is held in the first slave latch circuit 15 during the fault diagnosis of the second slave path. As has been described above, at the time of completion of the fault diagnosis of the first slave path, data corresponding to the input data D is held in the first slave latch circuit 15 by the operation of the shift register circuit 23. Accordingly, performing the fault diagnosis of the first slave path before the fault diagnosis of the second slave path may ensure that the fault diagnosis of the second slave path is initiated with data being properly held in the first slave latch circuit 15.

The fault diagnosis of the second slave path includes fault diagnosis of the second slave latch circuit 16.

Figure 5A:
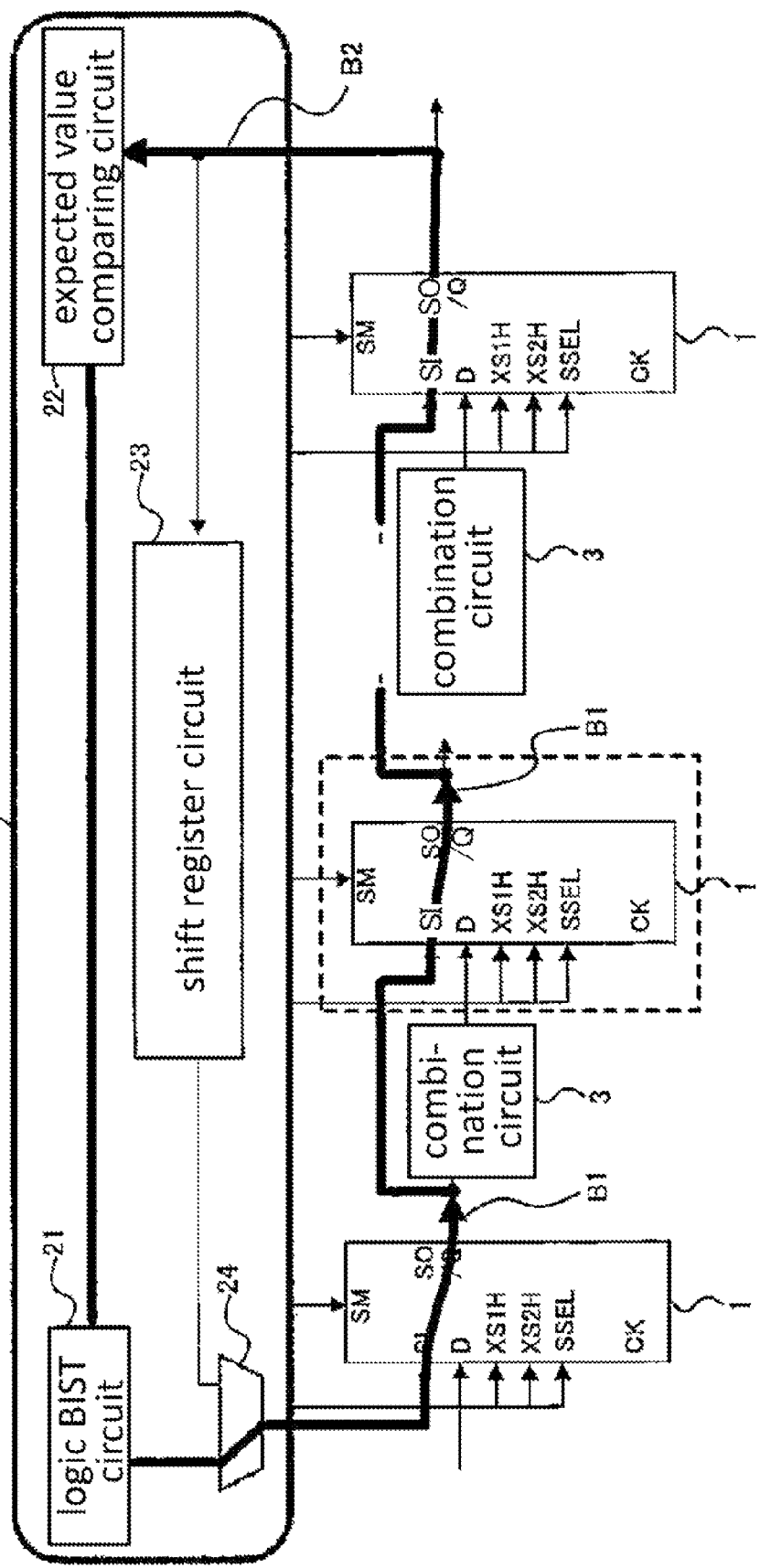
FIGS. 5A and 5B illustrate an exemplary fault diagnosis operation of a second slave path according to the first embodiment.
Figure 5B:
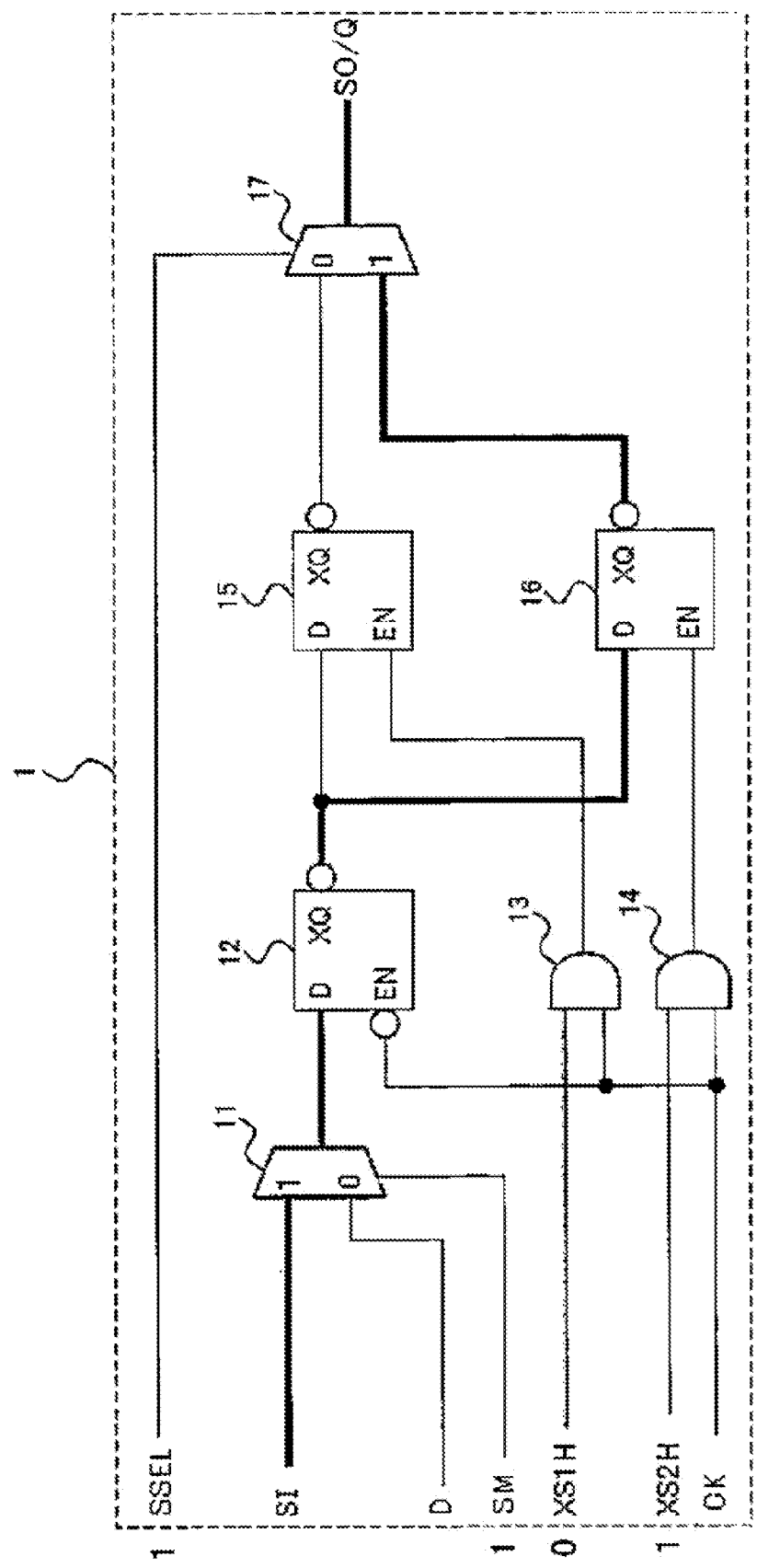

FIGS. 5A and 5B illustrate an example of a fault diagnosis operation on the second slave path according to the first embodiment. FIG. 5A illustrates an exemplary data flow relating to the SFFs 1 and the fault diagnosis circuit 2 in the fault diagnosis of the second slave path.

In the fault diagnosis of the second slave path, the logic BIST circuit 21 in the fault diagnosis circuit 2 generates scan data with which the second slave path may be appropriately tested. For example, the logic BIST circuit 21 generates three patterns of scan data such as "010". The scan data generated by the logic BIST circuit 21 is provided to the selector 24. The selector 24 selects the scan data to provide the scan data to the foremost SFF 1 as scan-in data SI.

Then the SFF 1 transfers the scan data to the next SFF 1, which then provides the scan data to the next, and so on, as indicated by arrow B1 in FIG. 5A. That is, one SFF 1 is provided with the scan-in data SI from the preceding SFF 1 and provides the scan-out data SO corresponding to the scan-in data SI to the subsequent SFF 1 by bypassing the combinational circuit 3. In this case, each of the SFFs 1 uses an output from the second slave latch circuit 16 in the SFF 1 to transfer the scan data. Each SFF 1 holds data corresponding to input data D that was input before the fault diagnosis in the first slave latch circuit 15 inside the SFF 1.

After the scan data is transferred in this way, the last SFF 1 provides scan-out data SO to the expected value comparing circuit 22 as indicated by arrow B2 in FIG. 5A. The expected value comparing circuit 22 compares the scan-out data SO output from the last SFF 1 with an expected value corresponding to the scan data generated by the logic BIST circuit 21 to make a fault diagnosis of the second slave path.

Unlike in the fault diagnosis of the first slave path, the shift register circuit 23 is not caused to operate since data is held in the first slave latch circuit 15 in the fault diagnosis of the second slave path.

FIG. 5B illustrates an example of main data flow relating to the SFF 1 in the dashed box in FIG. 5A in fault diagnosis of the second slave path. The thick lines in FIG. 5B represent the data flow. When the fault diagnosis of the second slave path is performed, the scan mode SM is set to "1". Accordingly, the selector 11 outputs scan-in data SI, which is then provided to the master latch circuit 12. The master latch circuit 12 outputs data corresponding to the scan-in data SI to the slave latch circuits 15 and 16 in response to the clock signal CK.

In the fault diagnosis of the second slave path, the first output hold signal XS1H is set to "0". Accordingly, the AND circuit 13 outputs "0", which is then provided to the first slave latch circuit 15 as a control signal. That is, the clock signal CK is blocked from being provided to the first slave latch circuit 15. In this case, the first slave latch circuit 15 holds a certain output irrespective of the input from the master latch circuit 12. For example, the first slave latch circuit 15 holds data corresponding to the input data D that was input before the fault diagnosis of the first slave path.

On the other hand, the second output hold signal XS2H is set to "1" in the fault diagnosis of the second slave path. Accordingly, the AND circuit 14 directly outputs the clock signal CK, which is then provided to the second slave latch circuit 16. In this case, the second slave latch circuit 16 outputs data corresponding to the data input from the master latch circuit 12 in response to the clock signal CK.

Furthermore, the selection signal SSEL is set to "1" in the fault diagnosis of the second slave path. Accordingly, the selector 17 outputs data corresponding to the data output from the second slave latch circuit 16, that is, data corresponding to the scan-in data SI, as scan-out data SO.

These signals set the circuits in each SFF 1 to enable proper fault diagnosis of the second slave path based on the scan data output from the second slave latch circuit 16 while data is held in the first slave latch circuit 15.

As has been described above, in the fault diagnosis of the second slave path, each of the SFFs 1 uses the output from the second slave latch circuit 16 to transfer scan data to the next SFF 1 while holding data input before the fault diagnosis in the first slave latch circuit 15. This mechanism enables proper fault diagnosis of the second slave path and facilitates return from the fault diagnosis operation to the normal operation. That is, the data held in the first slave latch circuit 15 can be used to readily return the SFFs 1 to the state they were in before the fault diagnosis.

(c) Fault Diagnosis of the Combinational Circuits

An example of fault diagnosis of the combinational circuits 3 according to the first embodiment will be described below. Like the fault diagnosis of the second slave path, fault diagnosis of the combinational circuits 3 uses an output from the second slave latch circuit 16 while data input before the fault diagnosis is held in the first slave latch circuit 15. That is, in the fault diagnosis of the combinational circuits 3, data is held in the first slave latch circuit 15 instead of the shift register circuit 23 as in the fault diagnosis of the first slave path described earlier.

The fault diagnosis of the combinational circuits 3 is preferably performed after the fault diagnosis of the first slave path. The reason is that it is desirable that the fault diagnosis of the combinational circuits 3 be performed after the proper operation of the first slave latch circuit 15 has been verified, because data is held in the first slave latch circuit 15 during the fault diagnosis of the combinational circuits 3. It is also preferable that the fault diagnosis of the combinational circuits 3 be performed after the fault diagnosis of the second slave path. The reason is that it is desirable that the fault diagnosis of the combinational circuits 3 be performed after the proper operation of the second slave latch circuit 16 has been verified, because an output from the second slave latch circuit 16 is used in the fault diagnosis of the combinational circuits 3.

As has been described above, the fault diagnosis of the second slave path is performed while data input before the fault diagnosis is held in the first slave latch circuit 15. Therefore, the fault diagnosis of the second slave path is performed before the fault diagnosis of the combinational circuit 3 so that the fault diagnosis of the combinational circuits 3 may be initiated with the data being properly held in the first slave latch circuit 15.

Figure 6A:
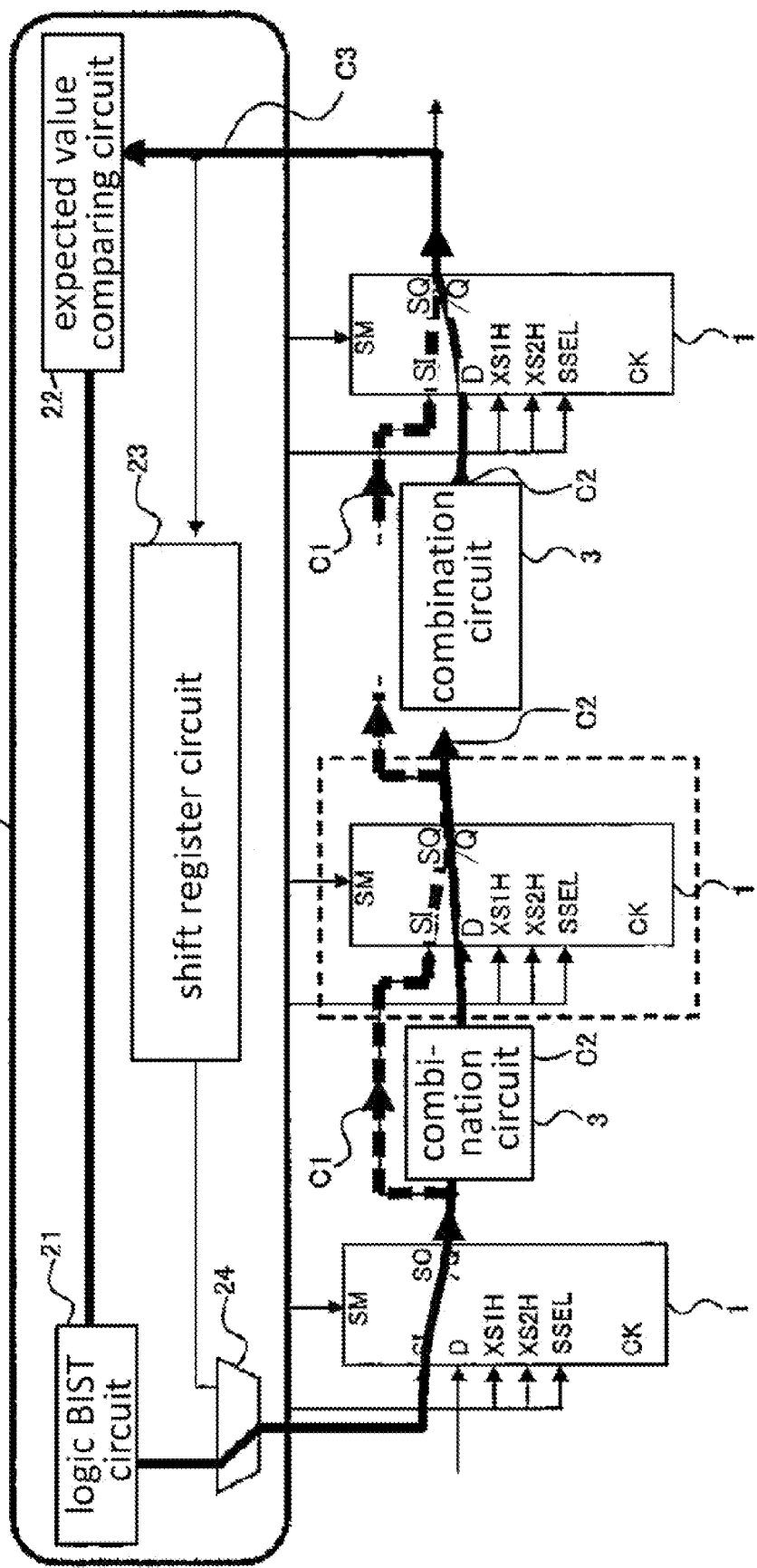
FIGS. 6A and 6B illustrate an exemplary fault diagnosis operation of combinational circuits according to the first embodiment.
Figure 6B:
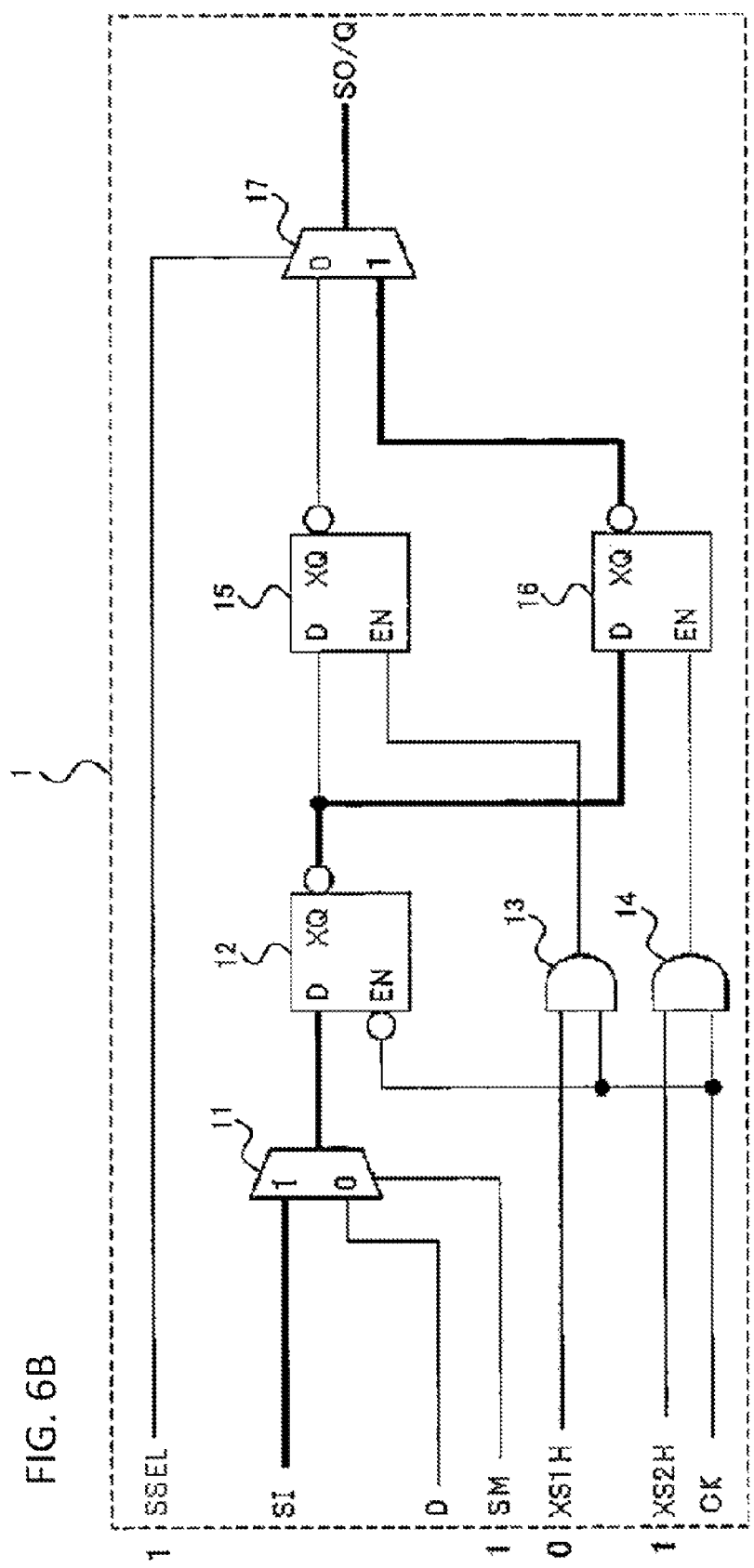

FIGS. 6A and 6B illustrate an example of a fault diagnosis operation on the combinational circuits 3 according to the first embodiment. FIG. 6A illustrates an example of data flow relating to the SFFs 1 and the fault diagnosis circuit 2 in the fault diagnosis of the combinational circuits 3.

In the fault diagnosis of the combinational circuits 3, the logic BIST circuit 21 in the fault diagnosis circuit 2 generates scan data with which the combinational circuits 3 may be appropriately tested. For example, the logic BIST circuit 21 generates scan data appropriate for testing the computation performed in each combinational circuit 3. For example, the logic BIST circuit 21 generates random pattern scan data. The scan data generated by the logic BIST circuit 21 is provided to the selector 24. The selector 24 selects the scan data to provide the scan data to the foremost SFF 1 as scan-in data SI.

When fault diagnosis of the combinational circuits 3 is performed, the fault diagnosis circuit 2 first sets the scan mode SM to "1". The setting causes the scan data described above to be transferred from one SFF 1 to another as indicated by dashed arrow C1 in FIG. 6A. For example, each SFF 1 is provided with scan-in data SI from the preceding SFF 1 and provides scan-out data SO corresponding to the scan-in data SI to the subsequent SFF 1 by bypassing the combinational circuit 3. To transfer the scan data, each SFF 1 uses an output from the second slave latch circuit 16 in the SFF 1. The SFF 1 holds data corresponding to the input data D input before the fault diagnosis in the first slave latch circuit 15 in the SFF 1.

Transferring the scan data in this way allows each of the SFFs 1 to hold the scan data with which the subsequent combinational circuit 3 can be tested. That is, each SFF 1 may output the scan data with which the subsequent combinational circuit 3 may be tested. For example, when the scan data has substantially been transferred to the last SFF 1, each SFF 1 is placed in that state. Then the fault diagnosis circuit 2 switches the scan mode SM from "1" to "0". In particular, the fault diagnosis circuit 2 sets and maintains the scan mode SM at "0" for one cycle of the clock signal CK. This allows each SFF 1 to be provided with data corresponding to the result of processing the scan data by the preceding combinational circuit 3 and to output that data, as indicated by arrow C2 in FIG. 6A.

The fault diagnosis circuit 2 then switches the scan mode SM from "0" to "1". In response to this, each of the SFFs 1 transfers data corresponding to the result of processing the scan data by the combinational circuit 3, as indicated by dashed arrow C1 in FIG. 6A. That is, data corresponding to the result of processing the scan data by the combinational circuits 3 are transferred from one SFF 1 to the next SFF 1 by bypassing the combinational circuits 3. The last SFF 1 provides data corresponding to the result of processing the scan data by the combinational circuits 3 to the expected value comparing circuit 22 as scan-out data SO as indicated by arrow C3 in FIG. 6A. The expected value comparing circuit 22 compares the scan-out data SO output from the last SFF 1 with an expected value that depends on the scan data generated by the logic BIST circuit 21 to make a fault diagnosis of the combinational circuits 3.

Unlike in the fault diagnosis of the first slave path, the shift register circuit 23 is not caused to operate since data is held in the first slave latch circuit 15 in the fault diagnosis of the combinational circuits 3.

FIG. 6B illustrates an example of main data flow relating to the SFF 1 in the dashed box in FIG. 6A in fault diagnosis of the combinational circuits 3. In this example, the scan mode SM is set to "1". In this case, the selector 11 outputs scan-in data SI, which is then provided to the master latch circuit 12. The master latch circuit 12 outputs data corresponding to the scan-in data SI to the slave latch circuits 15 and 16 in response to the clock signal CK.

When the fault diagnosis of the combinational circuits 3 is performed, the first output hold signal XS1H is set to "0". Accordingly, the AND circuit 13 outputs "0", which is then provided to the first slave latch circuit 15 as a control signal. That is, the clock signal CK is blocked from being provided to the first slave latch circuit 15. In this case, the first slave latch circuit 15 holds a certain output irrespective of the input from the master latch circuit 12. For example, the first slave latch circuit 15 holds data corresponding to input data D input before the fault diagnosis of the first slave path.

The second output hold signal XS2H, on the other hand, is set to "1" in the fault diagnosis of the combinational circuits 3. Accordingly, the AND circuit 14 directly outputs the clock signal CK, which is then provided to the second slave latch circuit 16. The second slave latch circuit 16 outputs data corresponding to data input from the master latch circuit 12 in response to the clock signal CK.

Furthermore, the selection signal SSEL is set to "1" in the fault diagnosis of the combinational circuits 3. Accordingly, the selector 17 outputs data corresponding to the data output from the second slave latch circuit 16, that is, data corresponding to the scan-in data SI, as scan-out data SO.

These signals set the circuits in each SFF 1 to enable proper fault diagnosis of the combinational circuits 3 based on the scan data output from the second slave latch circuit 16 while data is held in the first slave latch circuit 15.

As has been described above, in the fault diagnosis of the combinational circuits 3, each of the SFFs 1 uses the output from the second slave latch circuit 16 to transfer the scan data while holding data that was input before the fault diagnosis in the first slave latch circuit 15. This mechanism enables a proper fault diagnosis of the combinational circuits 3 and facilitates return from the fault diagnosis operation to the normal operation upon completion of the fault diagnosis. That is, the data held in the first slave latch circuit 15 may be used to return the SFFs 1 to the state they were in before the fault diagnosis.

(Process of Fault Diagnosis)

Figure 7:
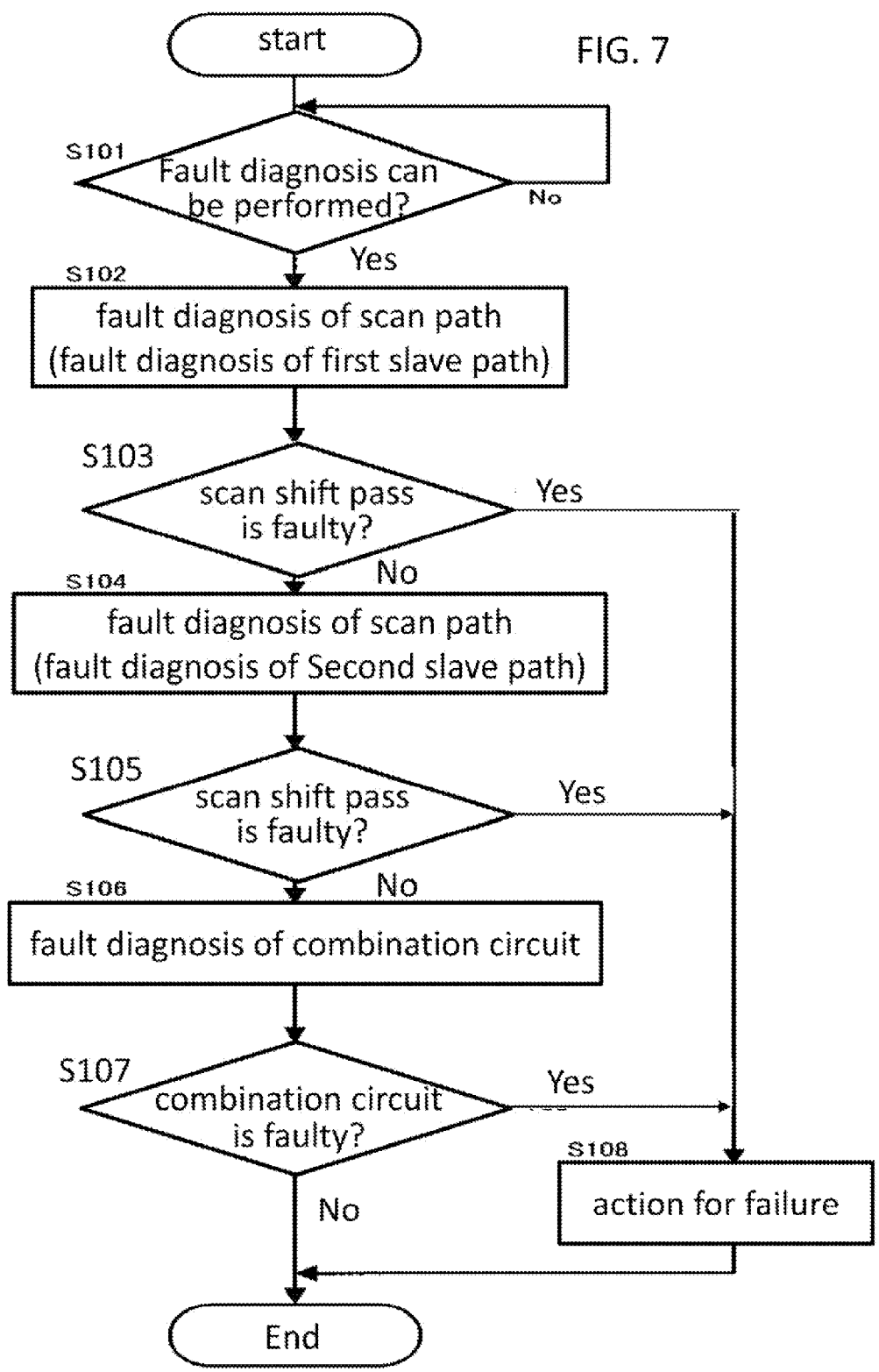
FIG. 7 is a flowchart of an exemplary fault diagnosis process according to the first embodiment.

A process of fault diagnosis according to the first embodiment will be described below. FIG. 7 is a flowchart illustrating an exemplary fault diagnosis process according to the first embodiment. Basically, the process is initiated during a normal operation of the SFFs 1. The process is performed by the fault diagnosis circuit 2.

At step S101, the fault diagnosis circuit 2 determines whether or not the circuit in which the SFFs 1 are embedded is in a state in which fault diagnosis of the SFFs 1 may be performed. For example, the fault diagnosis circuit 2 makes the determination based on processing currently being performed by the circuit in which the SFFs 1 are embedded. When the circuit is in a state in which the fault diagnosis may be performed (step S101: YES), the process proceeds to step S102; otherwise (step S101: NO), the process returns to step S101 and the normal operation is continued.

At step S102, the fault diagnosis circuit 2 performs fault diagnosis of the first slave path. For example, the logic BIST circuit 21 in the fault diagnosis circuit 2 first generates scan data with which the first slave path may be appropriately tested and the selector 24 in the fault diagnosis circuit 2 provides the scan data to the foremost one of the SFFs 1. In this case, the fault diagnosis circuit 2 sets the scan mode SM to "1", the first output hold signal XS1H to "1", the second output hold signal XS2H to "0", and the selection signal SSEL to "0". The settings allow the scan data output from the first slave latch circuit 15 in one SFF 1 to be transferred to the next, and so on. Then scan-out data SO is provided from the last SFF 1 to the expected value comparing circuit 22 in the fault diagnosis circuit 2. The expected value comparing circuit 22 compares the scan-out data SO with an expected value corresponding to the scan data generated by the logic BIST circuit 21 to make a fault diagnosis of the first slave path. In the fault diagnosis of the first slave path, the shift register circuit 23 in the fault diagnosis circuit 2 delays output data Q provided from the last SFF 1 by a period of time equivalent to the number of patterns of scan data and then outputs the output data Q to the selector 24. Upon completion of the processing described above, the process proceeds to step S103.

At step S103, the fault diagnosis circuit 2 determines on the basis of the result of the diagnosis at step S102 whether the first slave path is faulty or not. If the first slave path is faulty (step S103: YES), the process proceeds to step S108. In that case, a fault recovery action that depends on the fault is taken (step S108) and then the process will end. On the other hand, if the first slave path is not faulty (step S103: NO), the process proceeds to step S104.

At step S104, the fault diagnosis circuit 2 performs fault diagnosis of the second slave path. For example, first the logic BIST circuit 21 in the fault diagnosis circuit 2 generates scan data with which the second slave path may be appropriately tested and the selector 24 in the fault diagnosis circuit 2 provides the scan data to the foremost one of the SFFs 1. In this case, the fault diagnosis circuit 2 sets the scan mode SM to "1", the first output hold signal XS1H to "0", the second output hold signal XS2H to "1", and the selection signal SSEL to "1". The settings allow the data input before the fault diagnosis to be held in the first slave latch circuit 15 in each of the SFFs 1 while scan data output from the second slave latch circuit 16 in the SFF 1 is being transferred to the next SFF 1. Scan-out data SO is provided from the last SFF 1 to the expected value comparing circuit 22 in the fault diagnosis circuit 2. The expected value comparing circuit 22 compares the scan-out data SO with an expected value corresponding to the scan data generated by the logic BIST circuit 21 to make a fault diagnosis of the second slave path. Upon completion of the processing described above, the process proceeds to step S105.

At step S105, the fault diagnosis circuit 2 determines on the basis of the result of the diagnosis at step S104 whether the second slave path is faulty or not. If the second slave path is faulty (step S105: YES), the process proceeds to step S108. In that case, an action that depends on the fault is taken (step S108) and then the process will end. On the other hand, if the second slave path is not faulty (step S105: NO), the process proceeds to step S106.

At step S106, the fault diagnosis circuit 2 performs fault diagnosis of the combinational circuits 3. For example, first the logic BIST circuit 21 in the fault diagnosis circuit 2 generates scan data with which the combinational circuits 3 may be appropriately tested and the selector 24 in the fault diagnosis circuit 2 provides the scan data to the foremost one of the SFFs 1. The fault diagnosis circuit 2 sets the scan mode SM to "1", the first output hold signal XS1H to "0", the second output hold signal XS2H to "1", and the selection signal SSEL to "1". The settings allow the scan data output from the second slave latch circuit 16 in each SFF 1 to be transferred to the next SFF 1 while the data input before the fault diagnosis is held in the first slave latch circuit 15 in the SFF 1.

Transferring the scan data in this way allows each of the SFFs 1 to hold the scan data with which fault diagnosis of the subsequent combinational circuit 3 may be performed. In this state, the fault diagnosis circuit 2 switches the scan mode SM from "1" to "0" and keeps the scan mode SM at "0" for one cycle of clock signal CK. This allows each SFF 1 to be provided with data corresponding to the result of processing the scan data by the preceding combinational circuit 3 and to output that data. Then the fault diagnosis circuit 2 switches the scan mode SM from "0" to "1" to allow each SFF 1 to transfer data corresponding to the result of processing the scan data by the combinational circuit 3 to the subsequent SFF 1. Data corresponding to the result of processing the scan data by the combinational circuits 3 is provided from the last SFF 1 to the expected value comparing circuit 22 in the fault diagnosis circuit 2 as scan-out data SO. The expected value comparing circuit 22 compares the scan-out data SO with an expected value corresponding to the scan data generated by the logic BIST circuit 21 to make a fault diagnosis of the combinational circuits 3. Upon completion of the processing, the process proceeds to step S107.

At step S107, the fault diagnosis circuit 2 determines on the basis of the result of the diagnosis at step S106 whether the combinational circuits 3 are faulty or not. If any of the combinational circuits 3 is faulty (step S107: YES), the process proceeds to step S108. In that case, an action that depends on the fault is taken (step S108) and then the process will end. On the other hand, if none of the combinational circuits 3 is faulty (step S107: NO), the process will end. In that case, the normal operation of the SFFs 1 is resumed.

As has been described above, each of the SFFs 1 according to the first embodiment includes the master latch circuit 12 and the two slave latch circuits 15 and 16 to which data output from the master latch circuit 12 is provided. Each SFF 1 also includes the AND circuits 13 and 14 that may force the slave latch circuits 15 and 16, respectively, to hold data irrespective of the clock signal CK and the selector 17 that selects the output of one of the slave latch circuits 15 and 16. In fault diagnosis using scan data, each SFF 1 uses the output from the second slave latch circuit 16 to transfer the scan data to the next SFF 1 while holding data input before the fault diagnosis in the first slave latch circuit 15. That is, the SFF 1 uses the output from the second slave latch circuit 16 to perform the fault diagnosis while data that was input before the fault diagnosis is saved in the first slave latch circuit 15. This mechanism enables proper fault diagnosis of the SFFs 1 and combinational circuits 3 and facilitates switching from the fault diagnosis operation to the normal operation. That is, the normal operation may be quickly resumed simply by outputting the data held in the first slave latch circuit 15 upon completion of the fault diagnosis operation.

The fault diagnosis circuit 2 according to the first embodiment includes the shift register circuit 23 that holds output data Q provided from the last SFF 1 and outputs the output data Q with a time delay equivalent to the number of patterns of scan data during fault diagnosis of the first slave path. The shift register circuit 23 may appropriately return the SFFs 1 to the state they were in immediately before the fault diagnosis of the first slave path upon completion of the fault diagnosis. Accordingly, the fault diagnosis of the first slave latch circuit 15, which will hold the data input before fault diagnosis during fault diagnosis of the second slave path and the combinational circuits 3, may be appropriately performed. In particular, the fault diagnosis may be performed without loss of data corresponding to input data D that was input before the fault diagnosis.

While fault diagnosis of the second slave path is performed after fault diagnosis of the first slave path in the example of the first embodiment described above, fault diagnosis of the second slave path may be performed before fault diagnosis of the first slave path. Furthermore, while fault diagnosis of the combinational circuits 3 is performed after fault diagnosis of the first and second slave paths in the example, fault diagnosis of the combinational circuits 3 may be performed before fault diagnosis of the first and/or second slave path.

While an output from the second slave latch circuit 16 is used for fault diagnosis of the scan shift path in the example of the first embodiment described above, an output from the first slave latch circuit 15 may be used for fault diagnosis of the scan shift path. In that case, data that was input before the fault diagnosis is held in the second slave latch circuit 16 during the fault diagnosis.

Second Embodiment

A second embodiment will be described below. In the following description, the same components and signals described with respect to the first embodiment will be given the same reference numerals and the description of those components and signals will be omitted. Components and signals that are not described below are the same as their equivalents in the first embodiment.

(Exemplary Application)

Figure 8:
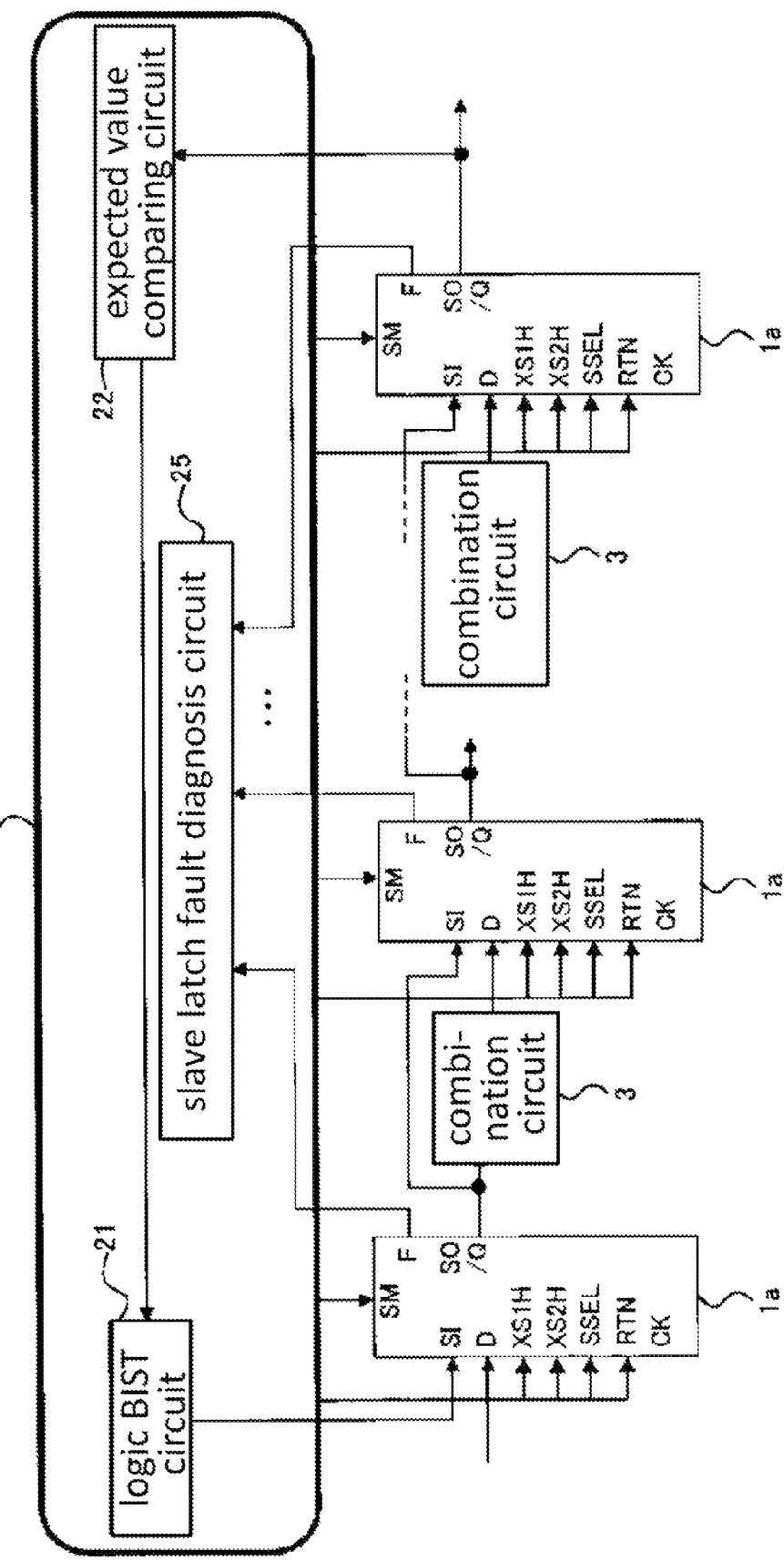
FIG. 8 is a block diagram illustrating an example of application of SFFs and a fault diagnosis circuit according to a second embodiment.

FIG. 8 is a block diagram illustrating an exemplary application of SFFs 1a and a fault diagnosis circuit 2a according to a second embodiment.

As illustrated in FIG. 8, the SFFs 1a differ from the SFFs 1 described previously in that the fault diagnosis circuit 2a provides a signal for setting a mode RTN for restoring data in the second slave latch circuit 16 (hereinafter the mode will be referred to as the "slave data return mode"). The slave data return mode RTN is set in order to return the second slave latch circuit 16 in each SFF 1a to the normal state the second slave latch circuit was in before fault diagnosis upon completion of the fault diagnosis. The return to the previous, normal state is accomplished by storing data held in the first slave latch circuit 15 in the second slave latch circuit 16, as will be described later in detail.

The SFFs 1a also differ from the SFFs 1 described previously in that the SFFs 1a output a signal F indicating whether the levels of outputs from slave latch circuits 15 and 16 are the same (hereinafter the signal will be referred to as the "output level determination signal F"). The output level determination signal F output from the SFFs 1a provided to the fault diagnosis circuit 2a.

The fault diagnosis circuit 2a differs from the fault diagnosis circuit 2 described previously in that the fault diagnosis circuit 2a does not include a shift register circuit 23 and a selector 24 but includes a slave latch fault diagnosis circuit 25. The fault diagnosis circuit 2a also differs from the fault diagnosis circuit 2 in that the fault diagnosis circuit 2a provides a signal for setting the slave data return mode RTN described above to the SFF 1a. Since the fault diagnosis circuit 2a does not include a selector 24, scan data output from a logic BIST circuit 21 is directly provided to the foremost SFF 1a as scan-in data SI.

The slave latch fault diagnosis circuit 25 is provided with the output level determination signal F from each of the SFFs 1a and makes a fault diagnosis of the slave latch circuits 15 and 16 in each SFF 1a on the basis of the output level determination signal F. When the output level determination signal F indicates disagreement between the outputs from the slave latch circuits 15 and 16, the slave latch fault diagnosis circuit 25 determines that at least one of the slave latch circuits 15 and 16 is faulty. Such fault diagnosis of the slave latch circuits 15 and 16 is performed by the slave latch fault diagnosis circuit 25 monitoring the output level determination signal F during normal operation of the SFF 1a. The slave latch fault diagnosis circuit 25 is an example of a second memory circuit fault diagnosis circuit.

(Configuration of the SFFs)

Figure 9:
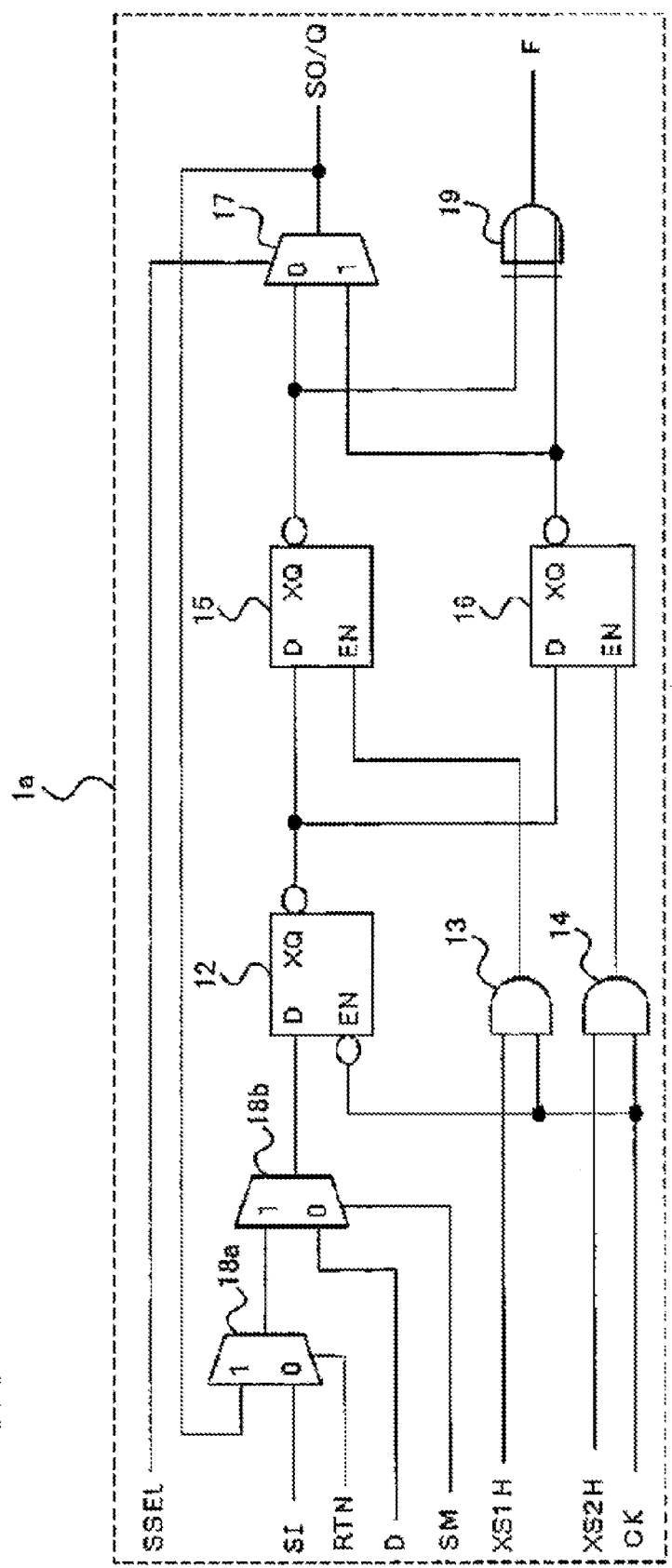
FIG. 9 is a block diagram illustrating an exemplary configuration of an SFF according to the second embodiment.

FIG. 9 is a block diagram illustrating an exemplary configuration of one of the SFFs 1a according to the second embodiment. As illustrated in FIG. 9, the SFF 1a differs from the SFF 1 described previously in that the SFF 1a includes selectors 18a and 18b and an XOR circuit 19. As described above, the SFF 1a provided with the signal for setting the slave data return mode RTN from the fault diagnosis circuit 2a.

The selector 18a is provided with scan-in data SI and data output from a selector 17 at the last stage. For example, the selector 18a is provided with output data Q corresponding to input data D from the last selector 17. The selector 18a is also provided with the signal for setting the slave data return mode RTN. The selector 18a selects and outputs one of the scan-in data SI and the output data Q depending on the slave data return mode RTN. For example, when the slave data return mode RTN is "0", the selector 18a outputs the scan-in data SI; when the slave data return mode RTN is "1", the selector 18a outputs the output data Q. Basically, the slave data return mode RTN is set to "0" for both normal operation and fault diagnosis. Upon completion of a fault diagnosis, the slave data return mode RTN is set to "1". The data output from the selector 18a is provided to the selector 18b.

The selector 18b is provided with scan-in data SI or output data Q output from the selector 18a as well as input data D. The selector 18b is also provided with a signal for setting a scan mode SM. The selector 18b selects and outputs one of the data output from the selector 18a or the input data D depending on the scan mode SM. For example, when the scan mode SM is "0", the selector 18b outputs the input data D; when the scan mode SM is "1", the selector 18b outputs the data output from the selector 18a. Basically, the scan mode SM is set to "0" in normal operation. In and immediately after fault diagnosis, the scan mode SM is set to "1". The data output from the selector 18b is provided to a master latch circuit 12. The selectors 18a and 18b are an example of an input selector circuit.

The XOR circuit 19 is provided with data output from the slave latch circuits 15 and 16. The XOR circuit 19 outputs an output level determination signal F indicating whether or not the data output from the slave latch circuits 15 and 16 are identical to each other. When the data output from the slave latch circuits 15 and 16 are not identical, the XOR circuit 19 outputs an output level determination signal F of "1". When the data output from the slave latch circuits 15 and 16 are identical, the XOR circuit 19 outputs an output level determination signal F of "0". The output level determination signal F output from the XOR circuit 19 is provided to the slave latch fault diagnosis circuit 25 in the fault diagnosis circuit 2a. The XOR circuit 19 is an example of an output level determination circuit.

(Example of Normal Operation)

An example of normal operation of the SFFs 1a and the fault diagnosis circuit 2a according to the second embodiment will be described below. In the second embodiment, the fault diagnosis circuit 2a performs fault diagnosis of the slave latch circuits 15 and 16 during the normal operation of the SFFs 1a.

Figure 10A:
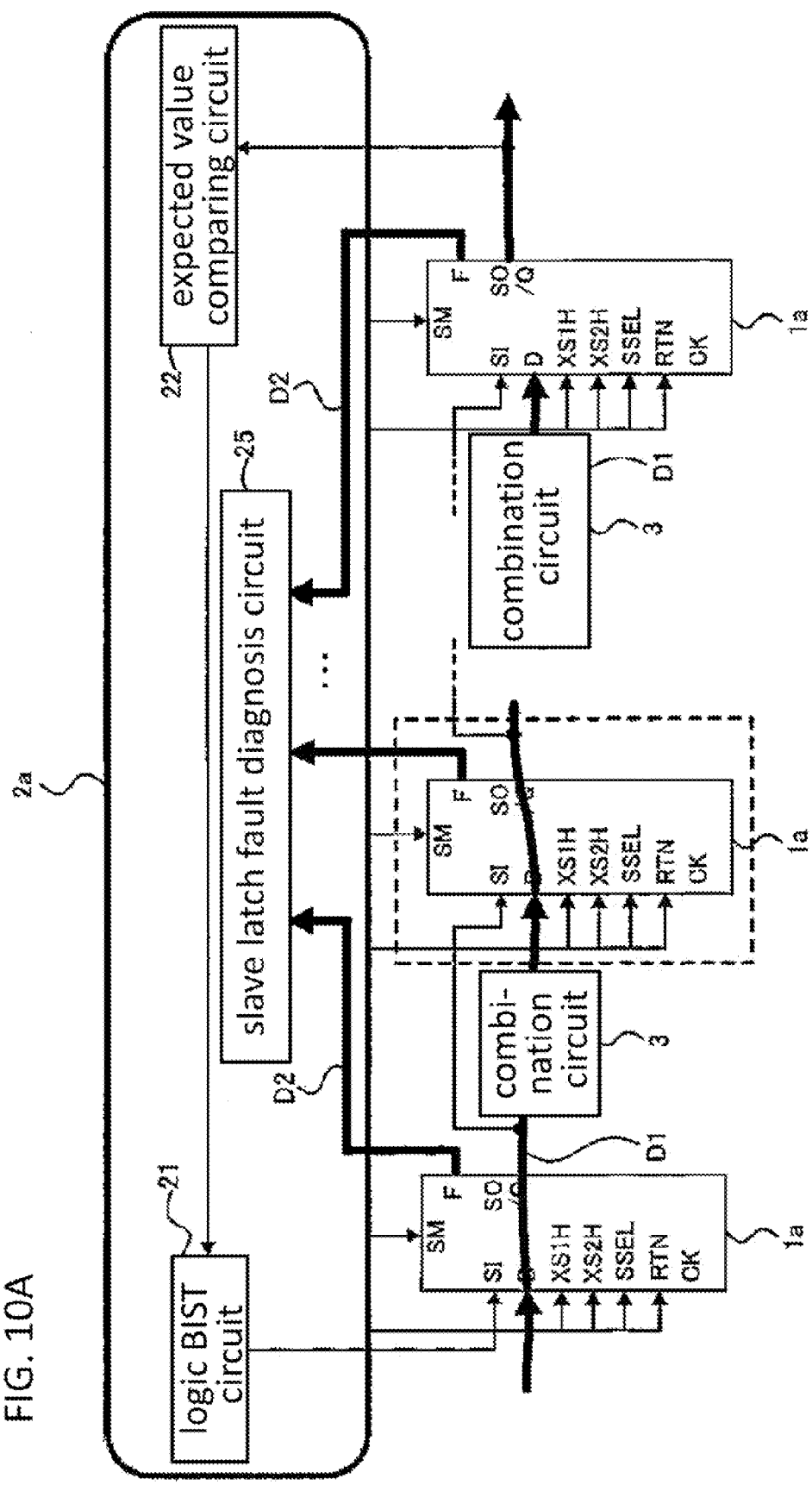
FIGS. 10A and 10B illustrate an exemplary normal operation of the SFFs and the fault diagnosis circuit according to the second embodiment.
Figure 10B:
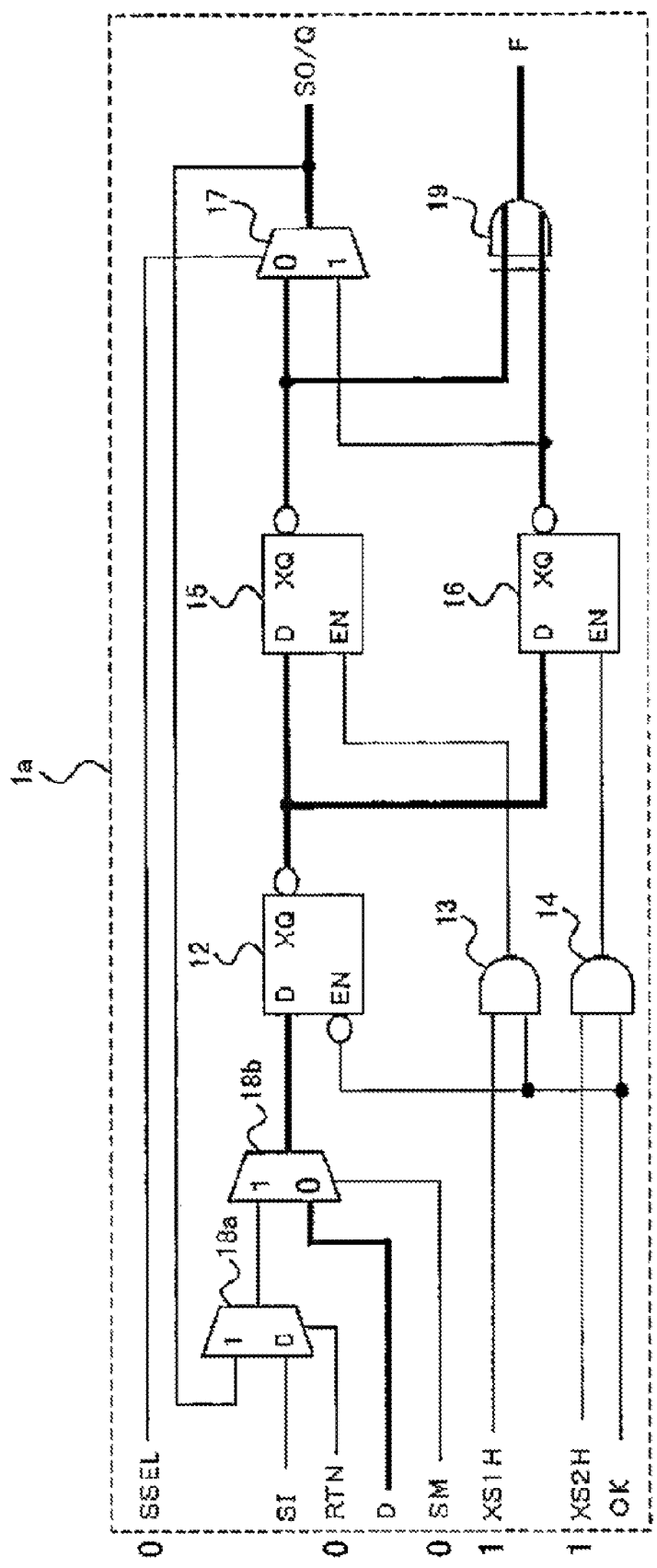

FIGS. 10A and 10B illustrate an example of normal operation of the SFFs 1a and the fault diagnosis circuit 2a according to the second embodiment.

FIG. 10A illustrates an exemplary data flow in normal operation of the SFFs 1a and the fault diagnosis circuit 2a. In the normal operation, each of the SFFs 1a is provided with input data D from the preceding combinational circuit 3 and provides output data Q corresponding to the input data D to the subsequent combinational circuit 3 in response to a clock signal CK as indicated by arrow D1 in FIG. 10A. Each combinational circuit 3 is provided with the output data Q from the preceding SFF 1a, performs a certain computation on the output data Q, and provides the result of the computation to the subsequent SFF 1a as input data D.

In the normal operation, each SFF 1a also provides the output level determination signal F to the slave latch fault diagnosis circuit 25 in the fault diagnosis circuit 2a as indicated by arrow D2 in FIG. 10A. The slave latch fault diagnosis circuit 25 makes a fault diagnosis of the slave latch circuits 15 and 16 in each SFF 1a on the basis of the output level determination signal F. When the output level determination signal F is "0", the slave latch fault diagnosis circuit 25 determines that the slave latch circuits 15 and 16 are functioning properly. On the other hand, when the output level determination signal F is "1", the slave latch fault diagnosis circuit 25 determines that at least one of the slave latch circuits 15 and 16 is faulty.

FIG. 10B illustrates an example of main data flow in the normal operation of the SFF 1a in the dashed box in FIG. 10A. The thick lines represent the data flow. In the normal operation, the slave data return mode RTN is set to "0" and the scan mode SM is also set to "0". Accordingly, the selector 18b outputs input data D, which is then provided to a master latch circuit 12. The master latch circuit 12 outputs data corresponding to the input data D to the slave latch circuits 15 and 16 in response to the clock signal CK.

In the normal operation, output hold signals XS1H and XS2H are both set to "1". Accordingly, the AND circuits 13 and 14 directly output the clock signal CK, which is then provided to the slave latch circuits 15 and 16. In this case, both of the slave latch circuits 15 and 16 output data corresponding to the data input from the master latch circuit 12. In the normal operation, a selection signal SSEL is set to "0". Accordingly, the selector 17 outputs data corresponding to the data output from the first slave latch circuit 15, that is, the data corresponding to the input data D, as output data Q.

In the normal operation, the XOR circuit 19 outputs the output level determination signal F indicating whether data output from slave latch circuits 15 and 16 are identical to each other. For example, when the data output from the slave latch circuits 15 and 16 are not identical, the XOR circuit 19 outputs an output level determination signal F of "1". On the other hand, when the data output from the slave latch circuits 15 and 16 are identical, the XOR circuit 19 outputs an output level determination signal F of "0".

While the selection signal SSEL is set to "0" in the normal operation in the example in FIG. 10, the selection signal SSEL may be set to "1", instead of "0". That is, the output data Q to use may be data corresponding to the data output from the second slave latch circuit 16 instead of the data corresponding to the data output from the first slave latch circuit 15.

As has been described above, according to the second embodiment, the XOR circuit 19 in each SFF 1a outputs the output level determination signal F indicating whether or not data output from the slave latch circuits 15 and 16 are identical to each other. The slave latch fault diagnosis circuit 25 in the fault diagnosis circuit 2a performs fault diagnosis of the slave latch circuits 15 and 16 on the basis of the output level determination signal F during the normal operation of the SFFs 1a. The mechanism enables a proper fault diagnosis of the slave latch circuits 15 and 16, which will hold data before fault diagnosis during the fault diagnosis of a scan shift path and the combinational circuits 3. For example, before fault diagnosis of the scan shift path and the combinational circuits 3, the slave latch circuits 15 and 16 may be tested in advance. That is, fault diagnosis of the scan shift path and the combinational circuits 3 may be performed after proper functioning of the slave latch circuits 15 and 16 has been verified.

(Example of Fault Diagnosis Operation)

An example of fault diagnosis operation according to the second embodiment will be descried below.

(a) Fault Diagnosis of a Scan Shift Path

An example of fault diagnosis of a path through which scan data is shifted by the SFFs 1a (scan shift path) in the second embodiment will be described first. In the second embodiment, the fault diagnosis of the scan shift path is performed by using an output from the second slave latch circuit 16 while data that was input before the fault diagnosis is held in the first slave latch circuit 15. In the second embodiment, fault diagnosis of the XOR circuit 19 is performed at the same time on the basis of the output level determination signal F during the fault diagnosis of the scan shift path.

The fault diagnosis of the scan shift path is initiated in the normal operation described above. For example, the normal operation is interrupted and the fault diagnosis of the scan shift path is initiated. Accordingly, the fault diagnosis of the scan shift path is performed after fault diagnosis of the slave latch circuits 15 and 16 based on the output level determination signal F has been performed. That is, the fault diagnosis of the scan shift path is performed after proper functioning of the slave latch circuits 15 and 16 has been verified.

Figure 11A:
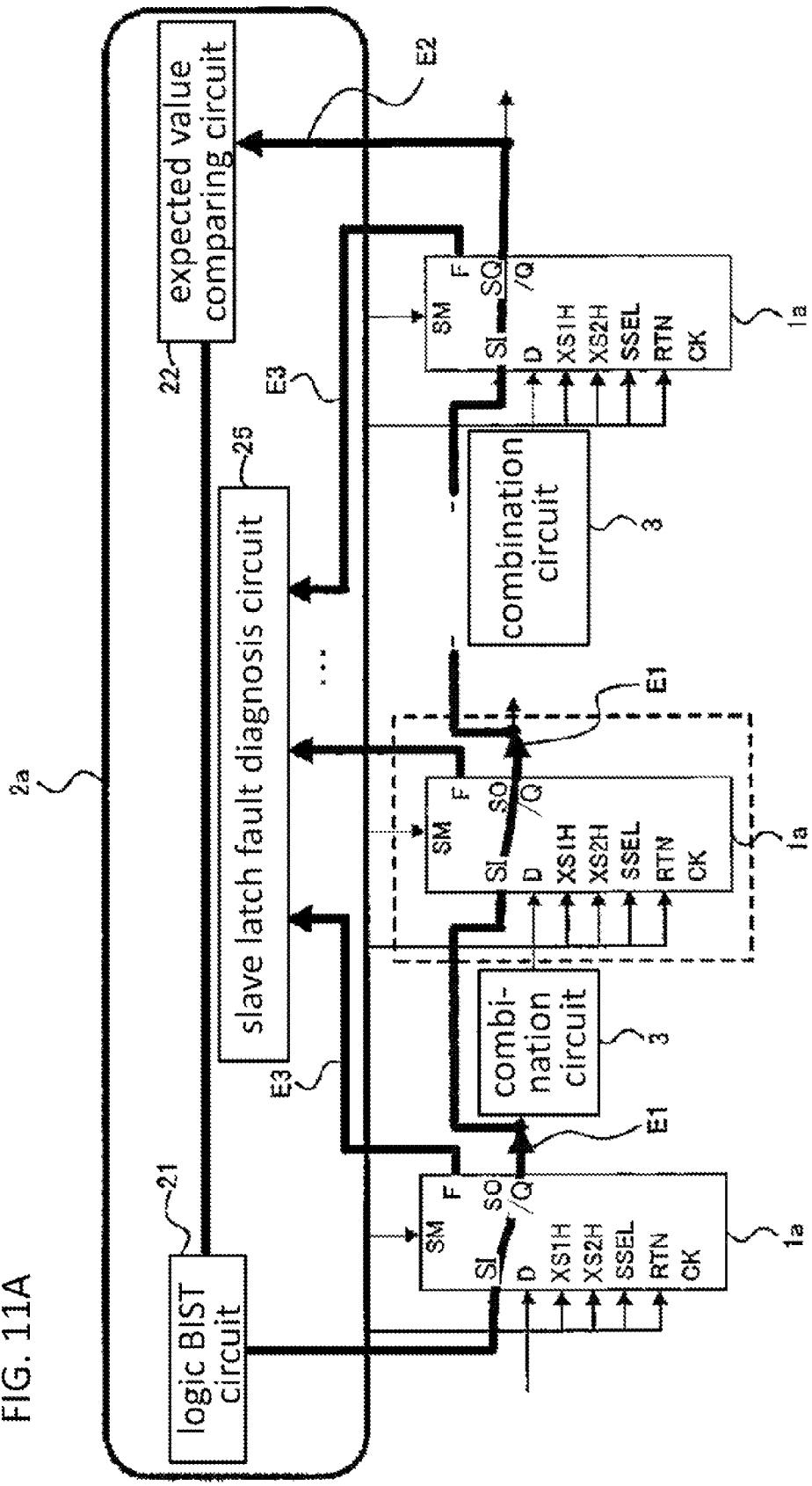
FIGS. 11A and 11B illustrate an exemplary fault diagnosis operation of a scan shift path according to the second embodiment.
Figure 11B:
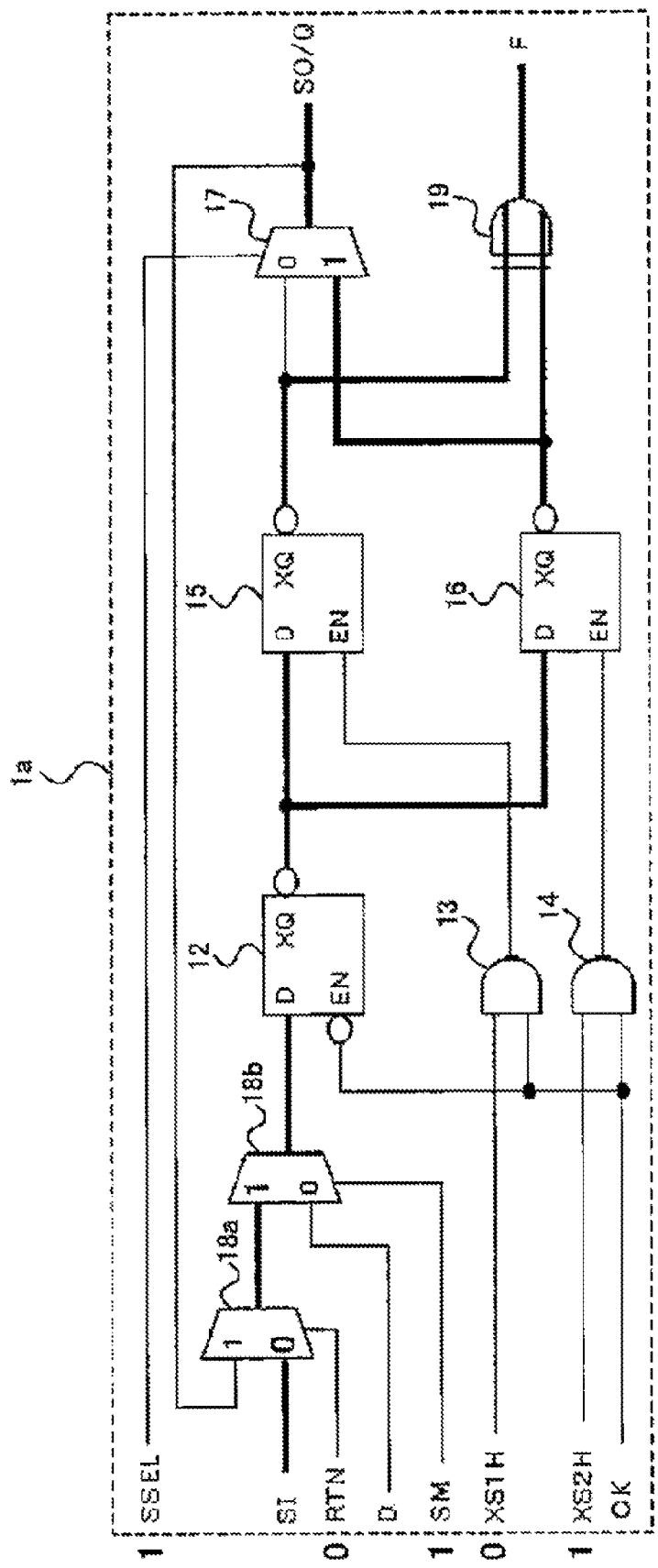

FIGS. 11A and 11B illustrate an example of fault diagnosis of the scan shift path according to the second embodiment. FIG. 11A illustrates an example of data flow relating to the SFFs 1a and the fault diagnosis circuit 2a in the fault diagnosis of the scan shift path.

In the fault diagnosis of the scan shift path, the logic BIST circuit 21 in the fault diagnosis circuit 2a generates scan data with which the scan shift path may be appropriately tested. For example, the logic BIST circuit 21 generates three patterns of scan data such as "010". The scan data generated by the logic BIST circuit 21 is provided to the foremost SFF 1a as scan-in data SI.

Then, the SFFs 1a transfer the scan data as indicated by arrow E1 in FIG. 11A. Each SFF 1a provided with the scan-in data SI from the preceding SFF 1a and provides scan-out data SO corresponding to the scan-in data SI to the subsequent SFF 1a by bypassing the combinational circuit 3. In this case, each SFF 1a uses an output from the second slave latch circuit 16 in the SFF 1a to transfer the scan data. Each SFF 1a holds data corresponding to input data D that was input before the fault diagnosis in the first slave latch circuit 15 in the SFF 1a.

After the scan data is transferred, the last SFF 1a provides scan-out data SO to an expected value comparing circuit 22 as indicated by arrow E2 in FIG. 11A. The expected value comparing circuit 22 compares the scan-out data SO output from the last SFF 1a with an expected value corresponding to the scan data generated by the logic BIST circuit 21 to make a fault diagnosis of the scan shift path.

In the fault diagnosis of the scan shift path described above, each of the SFFs 1a provides an output level determination signal F to the slave latch fault diagnosis circuit 25 in the fault diagnosis circuit 2a as indicated by arrow E3 in FIG. 11A. The slave latch fault diagnosis circuit 25 makes a fault diagnosis of the XOR circuit 19 on the basis of the output level determination signal F.

The principle of the fault diagnosis of the XOR circuit 19 will be described below. In fault diagnosis of the scan shift path, the first slave latch circuit 15 outputs a constant value because the first slave latch circuit 15 holds the data whereas the second slave latch circuit 16 outputs a value that depends on scan-in data SI. That is, the output from the first slave latch circuit 15 is a constant value whereas the output from the second slave latch circuit 16 is likely to vary. Since scan data is a pattern such as "010", that is, both "0" and "1" may be used in a pattern, the output of the second slave latch circuit 16 is likely to vary.

Therefore, basically the outputs from the slave latch circuits 15 and 16 in fault diagnosis of the scan shift path may or may not agree with each other. Accordingly, if the XOR circuit 19 functions properly, the value of the output level determination signal F from the XOR circuit 19 may vary. Conversely, if the value of the output level determination signal F does not vary, the XOR circuit 19 may be faulty.

For the reason stated above, fault diagnosis of the XOR circuit 19 is performed on the basis of the output level determination signal F output from the XOR circuit 19 during fault diagnosis of the scan shift path in the second embodiment. For example, the slave latch fault diagnosis circuit 25 determines that the XOR circuit 19 is properly functioning when the value of the output level determination signal F is varying, that is, the output from the XOR circuit 19 is alternating between "0" and "1". On the other hand, when the value of the output level determination signal F is not varying, that is, the XOR circuit 19 is continuously outputting one of "0" and "1", the slave latch fault diagnosis circuit 25 determines that the XOR circuit 19 is faulty.

FIG. 11B illustrates an example of main data flow relating to the SFF 1a in the dashed box in FIG. 11A in the fault diagnosis of the scan shift path. The thick lines represent the data flow. In fault diagnosis of the scan shift path, the slave data return mode RTN is set to "0" and the scan mode SM is set to "1". Accordingly, the selector 18a outputs scan-in data SI and the selector 18b outputs the scan-in data SI, which is then provided to the master latch circuit 12. The master latch circuit 12 outputs data corresponding to the scan-in data SI to the slave latch circuits 15 and 16 in response to the clock signal CK.

In the fault diagnosis of the scan shift path, the first output hold signal XS1H is set to "0". Accordingly, the AND circuit 13 outputs "0", which is provided to the first slave latch circuit 15 as a control signal. This means that the clock signal CK is blocked from being provided to the first slave latch circuit 15. In this case, the first slave latch circuit 15 holds a certain output irrespective of the input from the master latch circuit 12. For example, the first slave latch circuit 15 holds data corresponding to input data D that was input before the fault diagnosis of the scan shift path.

On the other hand, the second output hold signal XS2H is set to "1" in fault diagnosis of the scan shift path. Accordingly, the AND circuit 14 directly outputs the clock signal CK, which is then provided to the second slave latch circuit 16. In this case, the second slave latch circuit 16 outputs data that depends on data input from the master latch circuit 12 in response to the clock signal CK.

In the fault diagnosis of the scan shift path, the selection signal SSEL is set to "1". Accordingly, the selector 17 outputs data that depends on the data output from the second slave latch circuit 16, that is, data that depends on the scan-in data SI, as scan-out data SO.

Also in the fault diagnosis of the scan shift path, the XOR circuit 19 outputs the output level determination signal F indicating whether data output from both slave latch circuits 15 and 16 are identical to each other. For example, the XOR circuit 19 outputs an output level determination signal F of "1" when the data output from the slave latch circuits 15 and 16 are not identical. On the other hand, when the data output from the slave latch circuits 15 and 16 are identical, the XOR circuit 19 outputs an output level determination signal F of "0".

These signals set the circuits in each SFF 1a to enable a proper fault diagnosis of the scan shift path based on the scan data output from the second slave latch circuit 16 while holding data in the first slave latch circuit 15.

As has been described above, in the fault diagnosis of the scan shift path, each of the SFFs 1a use the output from the second slave latch circuit 16 to transfer the scan data while holding the data that was input before the fault diagnosis in the first slave latch circuit 15. This mechanism enables a proper fault diagnosis of the scan shift path and facilitates return from the fault diagnosis operation to the normal operation. That is, the data held in the first slave latch circuit 15 may be used to readily return the SFFs 1a to the state they were in before the fault diagnosis.

According to the second embodiment, the slave latch fault diagnosis circuit 25 in the fault diagnosis circuit 2a makes a fault diagnosis of the XOR circuit 19 on the basis of the output level determination signal F during the fault diagnosis of the scan shift path. In this way, fault diagnosis of the XOR circuit 19 may be performed appropriately at the same time during the fault diagnosis of the scan shift path. That is, fault diagnosis of the XOR circuit 19, which is responsible for performing fault diagnosis of the slave latch circuits 15 and 16, may be properly performed.

While data is transferred through the second slave path to perform the fault diagnosis of the scan shift path in the example described above, the data may be transferred through the first slave path instead of the second slave path to perform the fault diagnosis of the scan shift path. In that case, the fault diagnosis is performed while data that was input before the fault diagnosis is held in the second slave latch circuit 16.

(b) Fault Diagnosis of the Combinational Circuits

An example of fault diagnosis of the combinational circuits 3 according to the second embodiment will be described below. Fault diagnosis of the combinational circuits 3 is performed by using an output from the second slave latch circuit 16 while data that was input before the fault diagnosis is held in the first slave latch circuit 15.

Fault diagnosis of the combinational circuits 3 is preferably performed after fault diagnosis of the scan shift path. The reason is that the scan shift path is used in the fault diagnosis of the combinational circuits 3 and therefore it is desirable that fault diagnosis of the combinational circuits 3 be performed after the proper functioning of the scan shift path has been verified. Fault diagnosis of the combinational circuits 3 is performed after the normal operation described above. Therefore, the fault diagnosis of the combinational circuits 3 is performed after the proper functioning of the slave latch circuits 15 and 16 has been verified.

In the fault diagnosis of the combinational circuits 3, basically the slave latch fault diagnosis circuit 25 in the fault diagnosis circuit 2a does not operate. This is because fault diagnosis of the slave latch circuits 15 and 16 and fault diagnosis of the XOR circuit 19 have been already performed before the fault diagnosis of the combinational circuits 3.

Figure 12A:
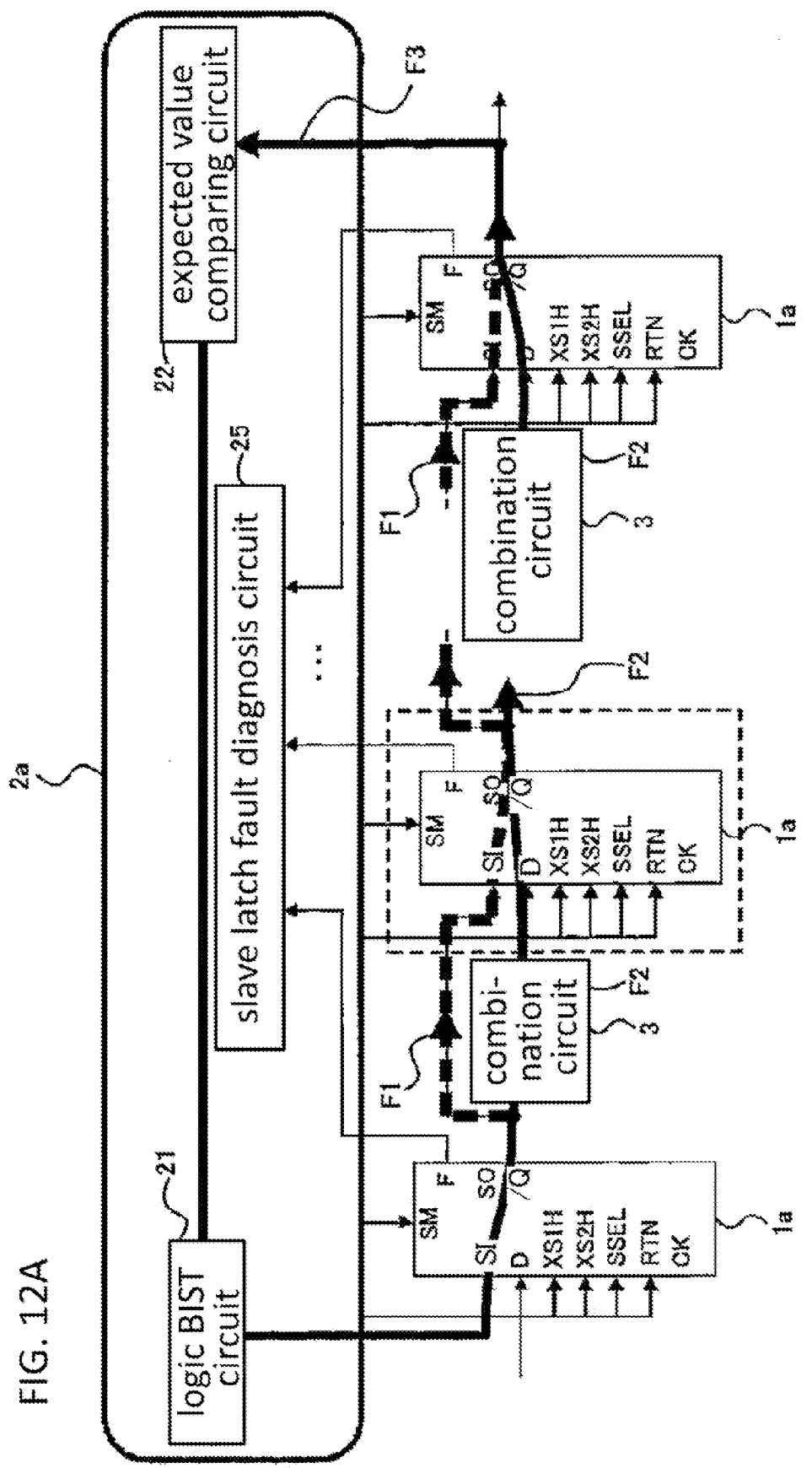
FIGS. 12A and 12B illustrate an exemplary fault diagnosis operation of combinational circuits according to the second embodiment.
Figure 12B:
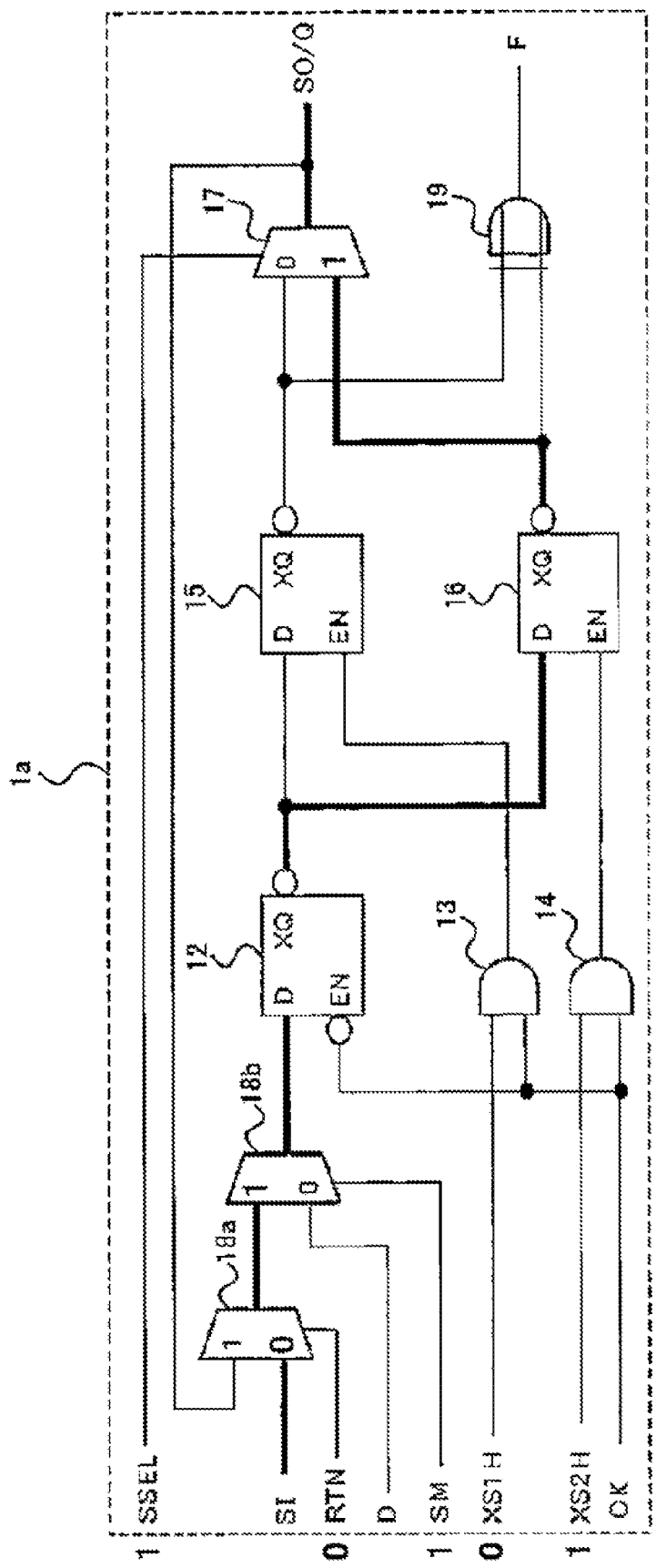

FIGS. 12A and 12B illustrate an example of fault diagnosis operation of the combinational circuits 3 according to the second embodiment. FIG. 12A illustrates an example of data flow relating to the SFFs 1a and the fault diagnosis circuit 2a in the fault diagnosis of the combinational circuits 3.

In the fault diagnosis of the combinational circuits 3, the logic BIST circuit 21 in the fault diagnosis circuit 2a generates scan data with which the combinational circuits 3 may be appropriately tested. For example, the logic BIST circuit 21 generates scan data appropriate for testing the computation performed by each combinational circuit 3. For example, the logic BIST circuit 21 generates a random pattern as scan data. The scan data generated by the logic BIST circuit 21 is provided to the foremost SFF 1a as scan-in data SI.

When the fault diagnosis of the combinational circuits 3 is performed, the fault diagnosis circuit 2a first sets the scan mode SM to "1". This setting causes the scan data described above to be transferred from one SFF 1a to the next SFF 1a and so on, as indicated by dashed arrow F1 in FIG. 12A. For example, each SFF 1a provided with scan-in data SI from the preceding SFF 1a and provides scan-out data SO corresponding to the scan-in data SI to the subsequent SFF 1a by bypassing the combinational circuit 3. To transfer the scan data, each SFF 1a uses an output from the second slave latch circuit 16 in the SFF 1a. Each SFF 1a holds data corresponding to input data D input before the fault diagnosis in the first slave latch circuit 15 in the SFF 1a.

Transferring the scan data in this way allows each of the SFFs 1a to hold the scan data with which the subsequent combinational circuit 3 may be appropriately tested. That is, each SFF 1a may output the scan data with which the subsequent combinational circuit 3 may be appropriately tested. For example, when the scan data has substantially been transferred to the last SFF 1a, each SFF 1a placed in that state. Then the fault diagnosis circuit 2a switches the scan mode SM from "1" to "0". In particular, the fault diagnosis circuit 2a sets and maintains the scan mode SM at "0" for one cycle of the clock signal CK. This allows each SFF 1a to be provided with data corresponding to the result of processing the scan data by the preceding combinational circuit 3 and to output that data, as indicated by arrow F2 in FIG. 12A.

The fault diagnosis circuit 2a then switches the scan mode SM from "0" to "1". In response to this, each of the SFFs 1a transfers data corresponding to the result of processing the scan data by the combinational circuit 3, as indicated by dashed arrow F1 in FIG. 12A. That is, data corresponding to the result of processing the scan data by the combinational circuits 3 are transferred from one SFF 1a to the next SFF 1a by bypassing the combinational circuits 3. The last SFF 1a provides data corresponding to the result of processing the scan data by the combinational circuits 3 to the expected value comparing circuit 22 as scan-out data SO as indicated by arrow F3 in FIG. 12A. The expected value comparing circuit 22 compares the scan-out data SO output from the last SFF 1a with an expected value that depends on the scan data generated by the logic BIST circuit 21 to make a fault diagnosis of the combinational circuits 3.

FIG. 12B illustrates an example of main data flow relating to the SFF 1a in the dashed box in FIG. 12A in the fault diagnosis of the combinational circuits 3. The thick lines represent the data flow. In the fault diagnosis of the combinational circuits 3, the slave data return mode RTN is set to "0" and the scan mode SM is set to "1". Accordingly, the selector 18a outputs scan-in data SI and the selector 18b outputs the scan-in data SI, which is then provided to the master latch circuit 12. The master latch circuit 12 outputs data corresponding to the scan-in data SI to the slave latch circuits 15 and 16 in response to the clock signal CK.

When the fault diagnosis of the combinational circuits 3 is performed, the first output hold signal XS1H is set to "0". Accordingly, the AND circuit 13 outputs "0", which is then provided to the first slave latch circuit 15 as a control signal. That is, the clock signal CK is blocked from being provided to the first slave latch circuit 15. In this case, the first slave latch circuit 15 holds a certain output irrespective of the input from the master latch circuit 12. For example, the first slave latch circuit 15 holds data corresponding to input data D input before the fault diagnosis of the scan shift path.

The second output hold signal XS2H, on the other hand, is set to "1" in the fault diagnosis of the combinational circuits 3. Accordingly, the AND circuit 14 directly outputs the clock signal CK, which is then provided to the second slave latch circuit 16. The second slave latch circuit 16 outputs data corresponding to data input from the master latch circuit 12 in response to the clock signal CK.

In the fault diagnosis of the combinational circuits 3, the selection signal SSEL is set to "1". Accordingly, the selector 17 outputs data corresponding to the data output from the second slave latch circuit 16, that is, data corresponding to the scan-in data SI, as scan-out data SO.

These signals set the circuits in each SFF 1a to enable a proper fault diagnosis of the combinational circuits 3 based on the scan data output from the second slave latch circuit 16 while data is held in the first slave latch circuit 15.

As has been described above, in the fault diagnosis of the combinational circuits 3, each of the SFFs 1a uses the output from the second slave latch circuit 16 to transfer the scan data while holding data that was input before the fault diagnosis in the first slave latch circuit 15. This mechanism enables a proper fault diagnosis of the combinational circuits 3 and facilitates return from the fault diagnosis operation to the normal operation. That is, the data held in the first slave latch circuit 15 may be used to return the SFFs 1a to the state they were in before the fault diagnosis.

(Operation for Returning to Normal State)

An example of operation for returning to a normal state the circuitry was in before fault diagnosis according to the second embodiment will be described below. In the second embodiment, the operation for returning the second slave latch circuit 16 to a normal state it was in before fault diagnosis is performed after completion of the fault diagnosis described above, in particular, in the period between the completion of the fault diagnosis and the resumption of the normal operation. Here, "returning the second slave latch circuit 16 to a normal state it was in before fault diagnosis" means that data corresponding to input data D that was in the second slave latch circuit 16 before the fault diagnosis is placed in the second slave latch circuit 16. Data corresponding to scan data is held in the second slave latch circuit 16 immediately after the completion of the fault diagnosis. The second slave latch circuit 16 in this state is returned to the state in which data that was input before the fault diagnosis is held in the second slave latch circuit 16.

For example, immediately after completion of the fault diagnosis operation, each of the SFFs 1a stores data held in the first slave latch circuit 15 into the second slave latch circuit 16, thereby returning the second slave latch circuit 16 to the normal state it was in before the fault diagnosis. This is done because it is desirable that outputs from the slave latch circuits 15 and 16 be made identical to each other before normal operation is resumed, since fault diagnosis of the slave latch circuits 15 and 16 will be performed based on the output level determination signal F in the normal operation after the fault diagnosis of the second slave latch circuit 16.

In the operation for returning to the normal state, the fault diagnosis circuit 2a basically performs no operation (except an operation for providing a signal for controlling the circuits in each SFF 1a).

Figure 13A:
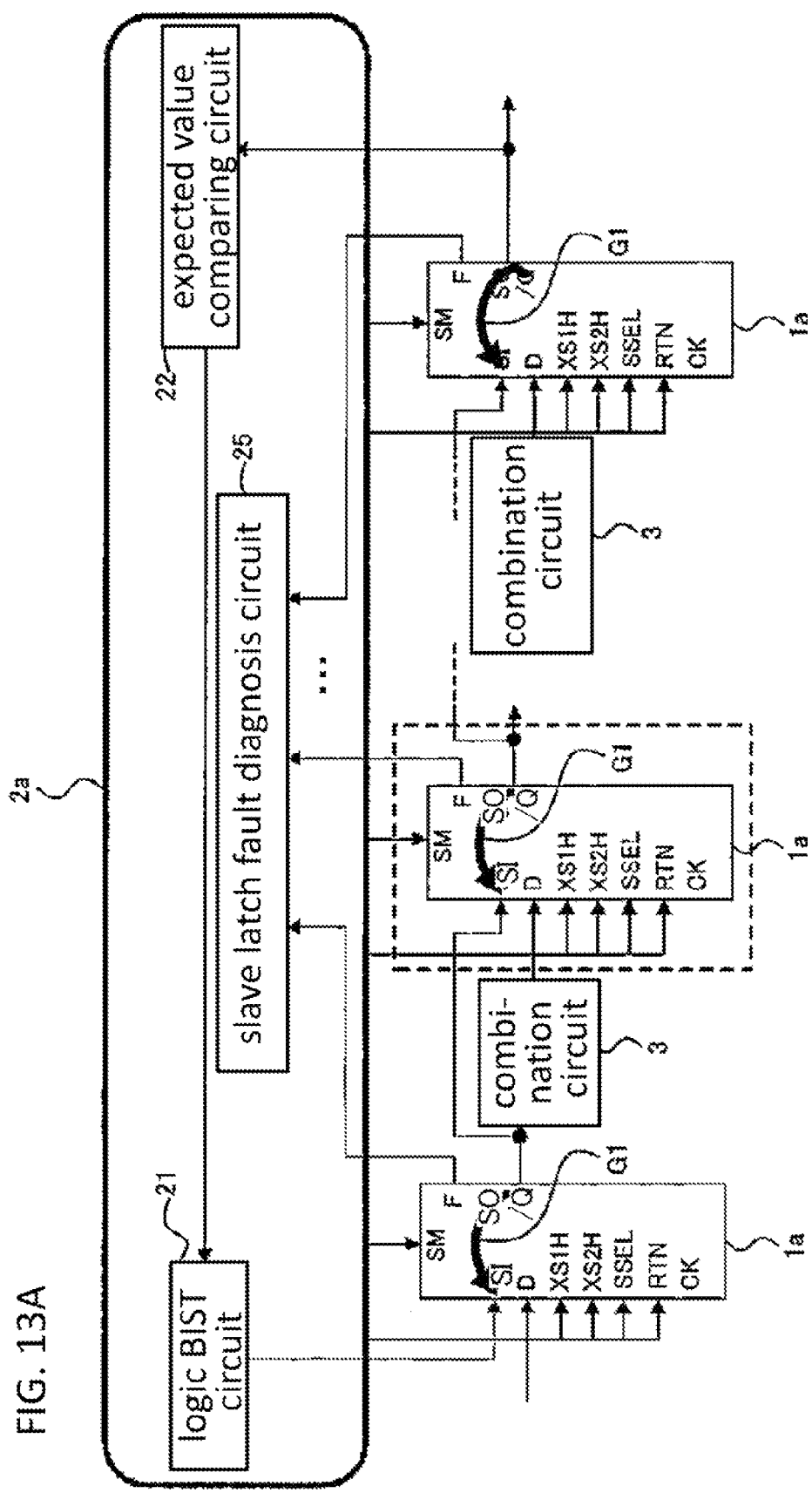
FIGS. 13A and 13B illustrate an exemplary operation for returning to a normal operation state according to the second embodiment.
Figure 13B:
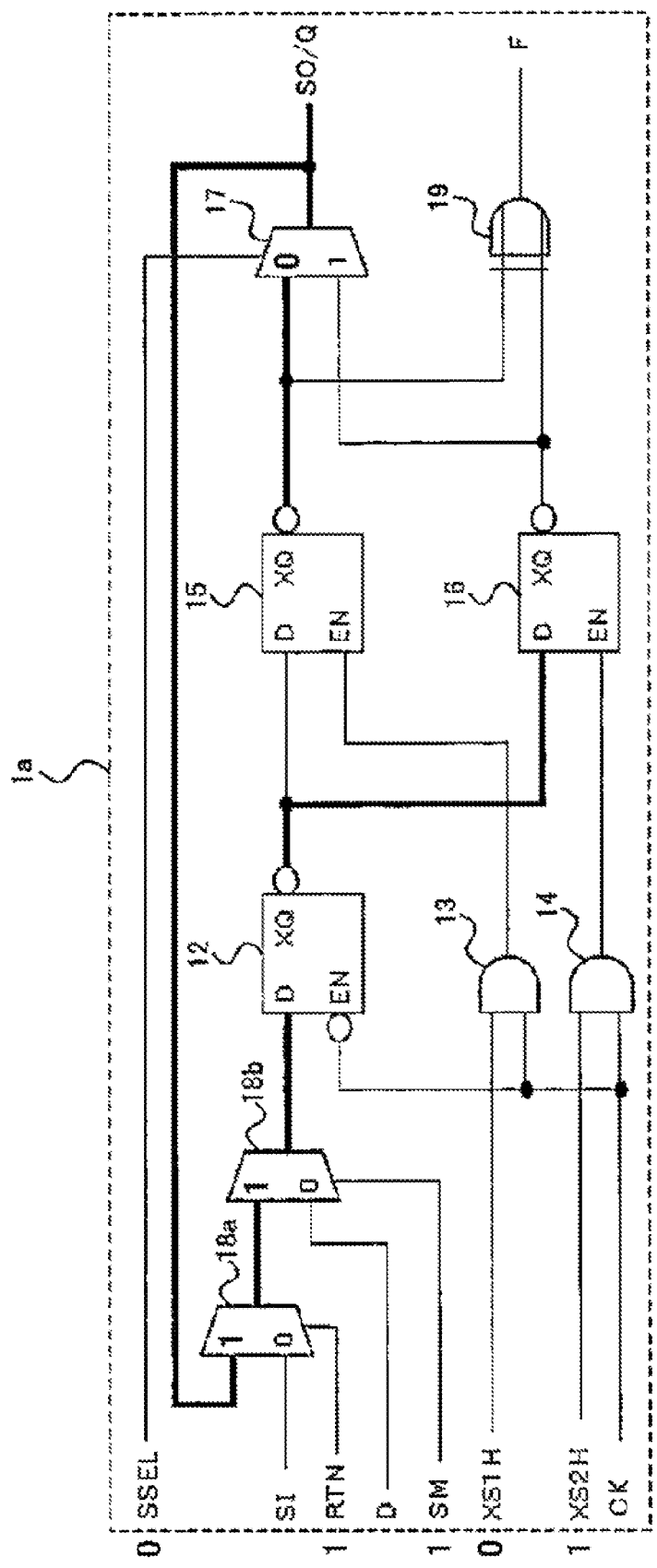

FIGS. 13A and 13B illustrate an example of return-to-normal state operation according to the second embodiment. FIG. 13A illustrates an example of data flow relating to the SFFs 1a in the return operation. For example, each of the SFFs 1a places data from its output back to its input as indicated by arrow G1 in FIG. 13A to return the second slave latch circuit 16 to the normal state it was in before the fault diagnosis.

FIG. 13B illustrates an example of main data flow in the return-to-normal state operation relating to the SFF 1a in the dashed box in FIG. 13A. The thick lines represent the data flow.

In the operation for returning to the normal state, the first output hold signal XS1H is set to "0". Accordingly, the AND circuit 13 outputs "0", which is then provided to the first slave latch circuit 15 as a control signal. In this case, the first slave latch circuit 15 holds a certain output irrespective of an input from the master latch circuit 12. For example, the first slave latch circuit 15 outputs data corresponding to input data D that was input before the fault diagnosis. The data output from the first slave latch circuit 15 is provided to the selector 17.

Also in the operation for returning to the normal state, the selection signal SSEL is set to "0". Accordingly, the selector 17 outputs data that depends on the data output from the first slave latch circuit 15. Since the data output from the first slave latch circuit 15 is data corresponding to the input data D that was input before the fault diagnosis, the selector 17 outputs the output data Q corresponding to the input data D. The output data Q output from the selector 17 is provided to the foremost selector 18a.

Also in the operation for returning to the normal state, the slave data return mode RTN is set to "1" and the scan mode SM is also set to "1". Accordingly, the selector 18a selects and outputs the data output from the selector 17 as stated above and the selector 18b selects and outputs the data output from the selector 18a. The data output from the selector 18b, that is, the data corresponding to the output data Q, is provided to the master latch circuit 12. The master latch circuit 12 outputs the data corresponding to the output data Q to the slave latch circuits 15 and 16 in response to the clock signal CK.

Also in the operation for returning to the normal state, the second output hold signal XS2H is set to "1". Accordingly, the AND circuit 14 directly outputs the clock signal CK, which is then provided to the second slave latch circuit 16. In this case, the second slave latch circuit 16 outputs data that depends on the data input from the master latch circuit 12, that is, data corresponding to the output data Q, in response to the clock signal CK. The state of the second slave latch circuit 16 described above is equivalent to the state in which the data corresponding to the input data D that was input before the fault diagnosis is held in the second slave latch circuit 16. That is, the state is equivalent to the state in which the data held in the first slave latch circuit 15 is stored in the second slave latch circuit 16.

These signals set the SFF 1a to enable the data held in the first slave latch circuit 15 to be properly stored in the second slave latch circuit 16.

As has been described above, after completion of fault diagnosis, each of the SFFs 1a performs the operation for returning the second slave latch circuit 16 to the normal state it was in before the fault diagnosis, that is, in the state in which the data that was input before the fault diagnosis is held in the second slave latch circuit 16. Consequently, the slave latch circuits 15 and 16 may output the same data when the normal operation is resumed and therefore fault diagnosis of the slave latch circuits 15 and 16 based on the output level determination signal F in the normal operation may be properly performed.

(Process of Fault Diagnosis)

Figure 14:
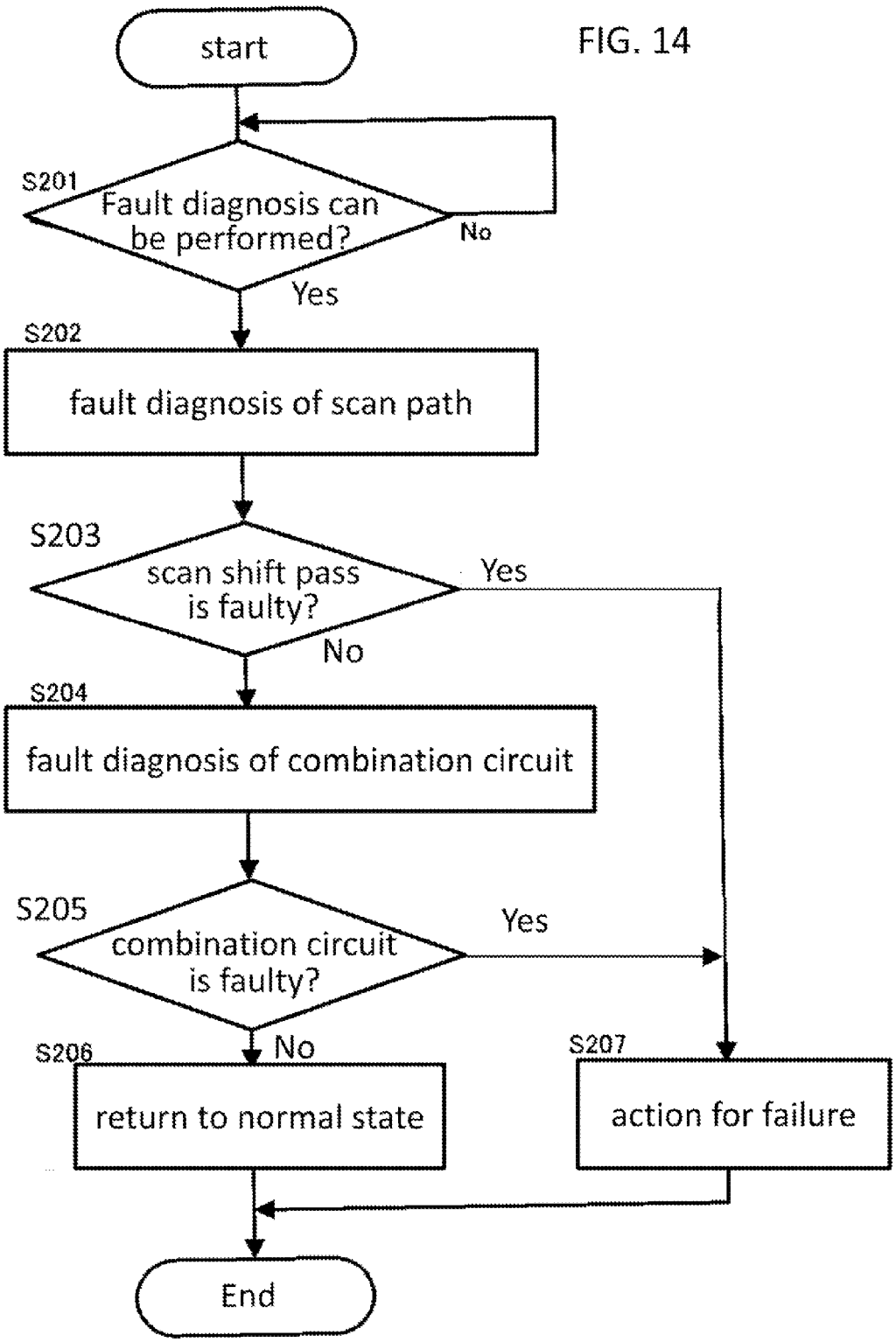
FIG. 14 is a flowchart of an exemplary fault diagnosis process according to the second embodiment.

A process of fault diagnosis according to the second embodiment will be described below. FIG. 14 is a flowchart illustrating an exemplary process of fault diagnosis according to the second embodiment. Basically, the process is started during a normal operation of the SFFs 1a. The process is performed by the fault diagnosis circuit 2a.

First at step S201, the fault diagnosis circuit 2a determines whether or not the circuit in which the SFFs 1a are embedded is in condition for fault diagnosis of the SFFs 1a. For example, the fault diagnosis circuit 2a makes the determination based on what processing is being performed by the circuit in which the SFFs 1a are embedded. If the circuit is in condition for fault diagnosis (step S201: YES), the process proceeds to step S202; otherwise (step S201: NO), the process returns to step S201 and the normal operation is continued.

At step S202, the fault diagnosis circuit 2a performs fault diagnosis of the scan shift path. For example, the logic BIST circuit 21 in the fault diagnosis circuit 2a generates scan data with which the scan shift path may be appropriately tested and provides the scan data to the foremost one of the SFFs 1a. The fault diagnosis circuit 2a sets the scan mode SM to "1", the first output hold signal XS1H to "0", and the second output hold signal XS2H to "1", and the selection signal SSEL to "1". The fault diagnosis circuit 2a also sets the slave data return mode RTN to "0". The settings cause scan data output from the second slave latch circuit 16 in each of the SFFs 1a to be transferred while data that was input before the fault diagnosis is held in the first slave latch circuit 15 in the SFF 1a. Scan-out data SO from the last SFF 1a provided to the expected value comparing circuit 22 in the fault diagnosis circuit 2a. The expected value comparing circuit 22 compares the scan-out data SO with an expected value that depends on the scan data generated by the logic BIST circuit 21 to make a fault diagnosis of the scan shift path. In addition, during the fault diagnosis of the scan shift path, the slave latch fault diagnosis circuit 25 in the fault diagnosis circuit 2a performs fault diagnosis of the XOR circuit 19 in each SFF 1a on the basis of the output level determination signal F output from the XOR circuit 19. After completion of the processing described above, the process proceeds to step S203. The data may be transferred through the first slave path instead of the second slave path to perform the fault diagnosis of the scan shift path.

At step S203, the fault diagnosis circuit 2a determines on the basis of the result of the diagnosis at step S202 whether or not the scan shift path is faulty. If the scan shift path is faulty (step S203: YES), the process proceeds to step S207. In that case, an action that depends on the fault is taken (step S207) and then the process will end. On the other hand, if the scan shift path is not faulty (step S203: NO), the process proceeds to step S204.

At step S204, the fault diagnosis circuit 2a performs fault diagnosis of the combinational circuits 3. For example, first the logic BIST circuit 21 in the fault diagnosis circuit 2a generates scan data with which the combinational circuits 3 may be appropriately tested and provides the scan data to the foremost one of the SFFs 1a. In this case, the fault diagnosis circuit 2a sets the scan mode SM to "1", the first output hold signal XS1H to "0", the second output hold signal XS2H to "1", and the selection signal SSEL to "1". The fault diagnosis circuit 2a also sets the slave data return mode RTN to "0". The settings cause scan data output from the second slave latch circuit 16 in each of the SFFs 1a to be transferred while data that was input before the fault diagnosis is held in the first slave latch circuit 15 in the SFF 1a.

Transferring the scan data in this way allows each of the SFFs 1a to hold the scan data with which fault diagnosis of the subsequent combinational circuit 3 may be performed. In this state, the fault diagnosis circuit 2a switches the scan mode SM from "1" to "0" and keeps the scan mode SM at "0" for one cycle of clock signal CK. This allows each SFF 1a to be provided with data corresponding to the result of processing the scan data by the preceding combinational circuit 3 and to output that data. Then the fault diagnosis circuit 2a switches the scan mode SM from "0" to "1" to allow each SFF 1a to transfer data corresponding to the result of processing the scan data by the combinational circuit 3 to the subsequent SFF 1a. Data corresponding to the result of processing the scan data by the combinational circuits 3 is provided from the last SFF 1a to the expected value comparing circuit 22 in the fault diagnosis circuit 2a as scan-out data SO. The expected value comparing circuit 22 compares the scan-out data SO with an expected value corresponding to the scan data generated by the logic BIST circuit 21 to make a fault diagnosis of the combinational circuits 3. Upon completion of the processing, the process proceeds to step S205.

At step S205, the fault diagnosis circuit 2a determines on the basis of the result of the diagnosis at step S204 whether the combinational circuits 3 are faulty or not. If any of the combinational circuits 3 is faulty (step S205: YES), the process proceeds to step S207. In that case, an action that depends on the fault is taken (step S207), and then the process will end. On the other hand, if none of the combinational circuits 3 is faulty (step S205: NO), the process proceeds to step S206.

At step S206, the fault diagnosis circuit 2a performs the operation for returning the second slave latch circuit 16 to a normal state the second slave latch circuit 16 was in before the fault diagnosis. In this case, the fault diagnosis circuit 2a sets the scan mode SM to "1", the first output hold signal XS1H to "0", the second output hold signal XS2H to "1", and the selection signal SSEL to "0". The fault diagnosis circuit 2a also sets the slave data return mode RTN to "1". These settings cause the data held in the first slave latch circuit 15 in each SFF 1a to be stored in the second slave latch circuit 16 after the completion of the fault diagnosis. That is, data that was input before the fault diagnosis is held in the second slave latch circuit 16 in the SFF 1a. Upon completion of step S206, the process will end and then the normal operation of the SFFs 1a will be resumed.

As has been described above, the XOR circuit 19 in each SFF 1a in the second embodiment outputs the output level determination signal F indicating whether or not data output from the slave latch circuits 15 and 16 are identical to each other. Then the slave latch fault diagnosis circuit 25 in the fault diagnosis circuit 2a performs fault diagnosis of the slave latch circuits 15 and 16 on the basis of the output level determination signal F during the normal operation of the SFFs 1a. In this way, the fault diagnosis of the slave latch circuit 15, which will hold data input before fault diagnosis during the fault diagnosis of the scan shift path and the combinational circuits 3, may be performed appropriately. For example, fault diagnosis of the slave latch circuits 15 and 16 may be performed in advance before the fault diagnosis of the scan shift path and the combinational circuits 3. While the first embodiment involves two fault diagnosis tests, one for the first slave path and the other for the second slave path, the second embodiment involves only one fault diagnosis test on the scan shift path. That is, according to the second embodiment, the number of path fault diagnosis tests may be reduced compared with the first embodiment.

Furthermore, the slave latch fault diagnosis circuit 25 in the fault diagnosis circuit 2a in the second embodiment performs fault diagnosis of the XOR circuit 19 on the basis of the output level determination signal F during the fault diagnosis of the scan shift path. In this way, fault diagnosis of the XOR circuit 19 may be appropriately performed at the same time as the fault diagnosis of the scan shift path. That is, fault diagnosis of the XOR circuit 19, which is responsible for performing fault diagnosis of the slave latch circuits 15 and 16, may be performed appropriately.

After the completion of the fault diagnosis, each of the SFFs 1a in the second embodiment performs the operation for returning the second slave latch circuit 16 to the normal state it was in before the fault diagnosis, that is, in the state in which the data that was input before the fault diagnosis is held in the second slave latch circuit 16. Consequently, the slave latch circuits 15 and 16 may output the same data when the normal operation is resumed and therefore fault diagnosis of the slave latch circuits 15 and 16 based on the output level determination signal F in the normal operation may be properly performed.

While the fault diagnosis of the combinational circuits 3 is performed after the fault diagnosis of the scan shift path in the example of the second embodiment described above, the fault diagnosis of the combinational circuits 3 may be performed before the fault diagnosis of the scan shift path.

While the output from the second slave latch circuit 16 is used to perform the fault diagnosis of the scan shift path in the example in the second embodiment described above, the output from the first slave latch circuit 15 may be used instead. In that case, the fault diagnosis is performed while the data that was input before the fault diagnosis is held in the second slave latch circuit 16. Also in that case, the data held in the second slave latch circuit 16 is stored into the first slave latch circuit 15 to return the first slave latch circuit 15 to the normal state the first slave latch circuit 15 was in before the fault diagnosis.

(Variation)

While each of the SFFs in the embodiments described above includes two slave latch circuits (the first and second slave latch circuits 15 and 16), each SFF may include three or more slave latch circuits. If one or more of the slave latch circuits in such an SFF 1*a* diagnosed as faulty, the other slave latch circuits may be used to take a fault recovery action. That is, the other, non-faulty slave latch circuits may be used to perform normal operation appropriately.

All examples and conditional language recited herein are intended for pedagogical purposes to aid the reader in understanding the invention and the concepts contributed by the inventor to furthering the art, and are to be construed as being without limitation to such for example recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. An integrated circuit comprising:
a first selection circuit for selecting a first data from an input data or a scan data, and outputting the first data, the scan data composing a logic pattern that is used for performing a diagnosis of a combinational circuit, the input data being received from a combinational circuit;
a first latch circuit for holding the first data as a first output data in accordance with a first signal;
a second latch circuit for holding the first output data as a second output data in accordance with which of the first signal and a second signal, the second signal being used to force the second latch circuit to hold the first output data independently of the first signal;
a third latch circuit for holding the first output data as a third output data in accordance with which of the first signal and a third signal, the third signal being used to force the third latch circuit to hold the first output data independently of the first signal; and
a second selection circuit for selecting a second data from among a plurality of data which include the second output data and the third output data, and outputting the second data.

2. The diagnosis circuit having a plurality of the integrated circuit in accordance with claim 1, the diagnosis circuit comprising:
a control circuit for controlling a logic state of a plurality of signals which include the second signal and the third signal and outputting the plurality of signals which include the second signal and the third signal;
a logic Built-In-Self-Test (BIST) circuit for providing BIST data, the BIST data composing a logic pattern that is used for performing a diagnosis of a combinational circuit;
a shift register circuit for latching the second data that is output from which one of the plurality of integrated circuits and outputting delayed data that is created by delaying the second data latched by the shift register;
a third selection circuit for selecting the scan data from the BIST data or the delayed data.

3. The diagnosis circuit in accordance with claim 2,
wherein in diagnosing with the first latch circuit, the control circuit output a plurality of signals which include the second signal and the third signal so as to force the second latch circuit and the third latch circuit to hold the first output data, and the third selection circuit selects the BIST data as the scan data.

4. The diagnosis circuit in accordance with claim 2,
wherein in diagnosing with the second latch circuit or the third latch circuit, the control circuit output a plurality of signals which include the second signal and the third signal so as to allow the second latch circuit and the third latch circuit to latch the first output data by the first signal, and the third selection circuit selects the delayed data as the scan data.

5. An integrated circuit comprising:
a first selection circuit for selecting a first data from a plurality of data that include an input data or a scan data, and outputting the first data, the scan data composing a logic pattern that is used for performing a diagnosis of a combinational circuit, the input data being received from a combinational circuit;
a first latch circuit for holding the first data as a first output data in accordance with a first signal;
a second latch circuits for holding the first output data as a second output data in accordance with which of the first signal and a second signal, the second signal being used to force the second latch circuit to hold the first output data independently of the first signal;
a third latch circuits for holding the first output data as a third output data in accordance with which of the first signal and a third signal, the third signal being used to force the third latch circuit to hold the first output data independently of the first signal;
a second selection circuit for selecting a second data from among a plurality of data which include the second output data and the third output data, and outputting the second data; and
a comparison circuit for comparing the second output data with the third output data, the comparison circuit output a result data that is in accordance with a result of comparing the second output data with the third output data.

6. The diagnosis circuit having a plurality of the integrated circuit in accordance with claim 5, the diagnosis circuit comprising:
a control circuit for controlling a logic state of a plurality of signals which include the second signal and the third signal and outputting the plurality of signals which include the second signal and the third signal;
a logic BIST circuit for providing BIST data, the BIST data composing a logic pattern that is used for performing a diagnosis of a combinational circuit; and
a third selection circuit for selecting the scan data from the BIST data or the delayed data, wherein the first selection circuit for selecting the first data from a plurality of data that include the input data, the scan data or a return data, the return data being one of the second data output from the second selection circuit.

7. The diagnosis circuit in accordance with claim 6, further comprising:
a slave latch fault diagnosis circuit for performing a diagnosis of the integrated circuit in accordance with the result data output from the comparison circuit.

8. The diagnosis circuit in accordance with claim 7, wherein the slave latch fault diagnosis circuit perform the diagnosis of the second latch circuit and the third latch circuit by using the input data, the input data being received from the combinational circuit that is operated in a normal operation.

9. The diagnosis circuit in accordance with claim 7, wherein the slave latch fault diagnosis circuit performed the diagnosis of the comparison circuit by using the result data, the result data being output from the comparison circuit while the diagnosis of the combinational circuit is performed by using the scan data.

\* \* \* \* \*